United States Patent [19]
Lanni

[11] Patent Number: 5,636,110
[45] Date of Patent: Jun. 3, 1997

[54] SMALL FORM FACTOR POWER SUPPLY

[75] Inventor: Thomas W. Lanni, Laguna Niguel, Calif.

[73] Assignee: Comarco Wireless Technologies, Inc., Irvine, Calif.

[21] Appl. No.: 567,369

[22] Filed: Dec. 4, 1995

Related U.S. Application Data

[63] Continuation-in-part of Ser. No. 233,121, Apr. 26, 1994, Pat. No. 5,479,331.

[60] Provisional application No. 60/002,488, Aug. 17, 1995.

[51] Int. Cl.$^6$ .................................................. H02M 3/335
[52] U.S. Cl. ........................... 363/21; 363/144; 363/147; 363/97
[58] Field of Search .................................. 363/17, 20, 24, 363/21, 25, 78, 79, 80, 97, 98, 132, 144, 147; 323/212

[56] References Cited

U.S. PATENT DOCUMENTS

| | | |
|---|---|---|
| 4,257,089 | 3/1981 | Ravis ........................................ 363/25 |
| 4,307,441 | 12/1981 | Bello ........................................ 363/25 |
| 4,622,627 | 11/1986 | Rodriguez et al. ................... 363/37 |
| 4,734,839 | 3/1988 | Barthold ................................ 363/16 |
| 4,885,674 | 12/1989 | Varga et al. ........................... 363/21 |
| 4,890,214 | 12/1989 | Yamamoto ............................. 363/49 |
| 5,019,954 | 5/1991 | Bourgeault et al. ................... 363/21 |
| 5,146,394 | 9/1992 | Ishii et al. .............................. 363/16 |
| 5,177,675 | 1/1993 | Archer .................................... 363/25 |
| 5,184,291 | 2/1993 | Crowe et al. .......................... 363/37 |
| 5,309,348 | 5/1994 | Leu ......................................... 363/71 |
| 5,479,331 | 12/1995 | Lenni ....................................... 363/21 |

*Primary Examiner*—Peter S. Wong
*Assistant Examiner*—Adolf Berhane
*Attorney, Agent, or Firm*—Loeb & Loeb LLP

[57] ABSTRACT

A new, small form factor power supply is disclosed that provides a regulated DC power supply in a package that radiates relatively little heat and that occupies 2.85×5.0× 0.436 inches. The secondary coil of the transformer is positioned at the summing node of the flux of the primary coils and the phase of the drive signals provided to the secondary coils is regulated to control the current and voltage provided by the secondary circuit. Preferably, all circuit components are surface mount devices and the transformer cores are E block planar cores mounted on the printed circuit board.

55 Claims, 21 Drawing Sheets

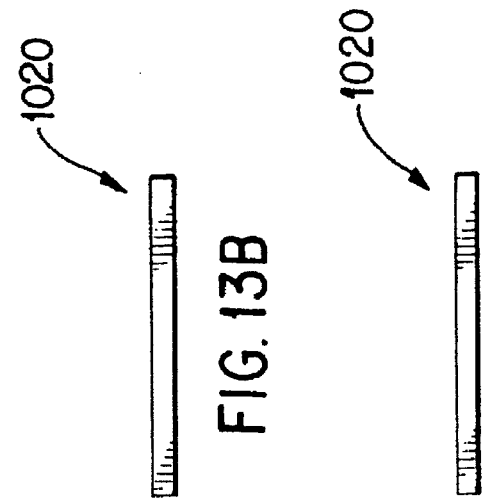
FIG. 13A
FIG. 13B
FIG. 13C
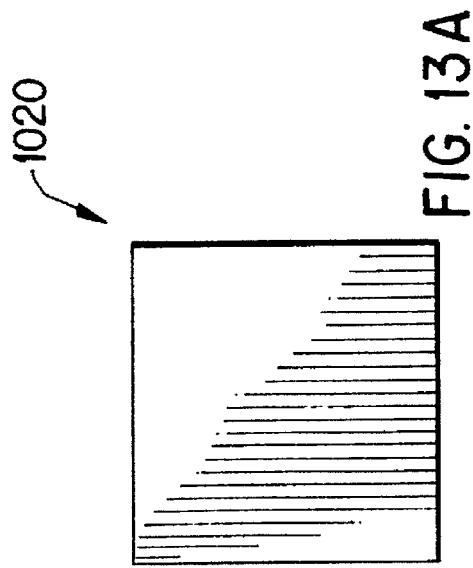
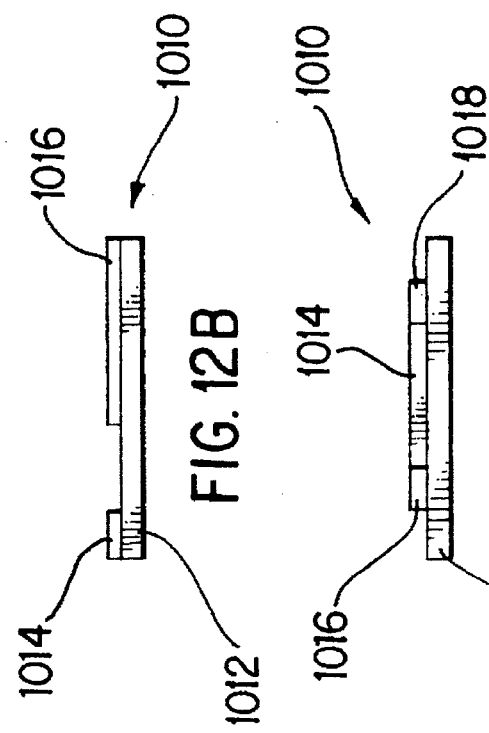
FIG. 12A
FIG. 12B
FIG. 12C
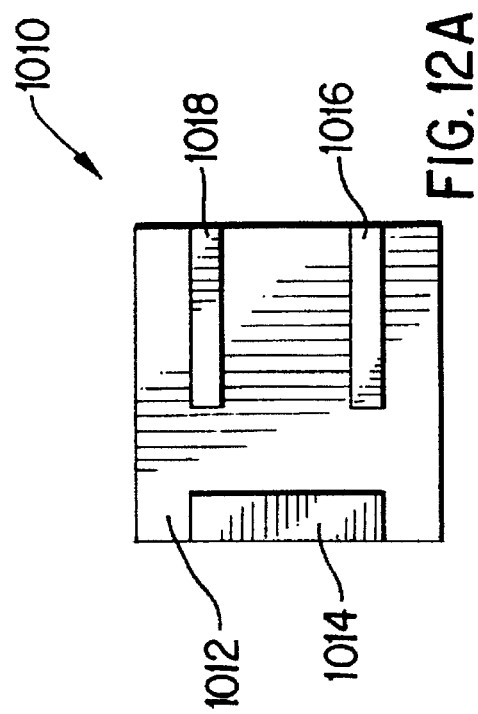

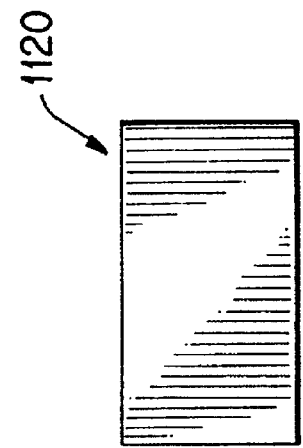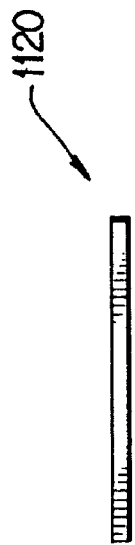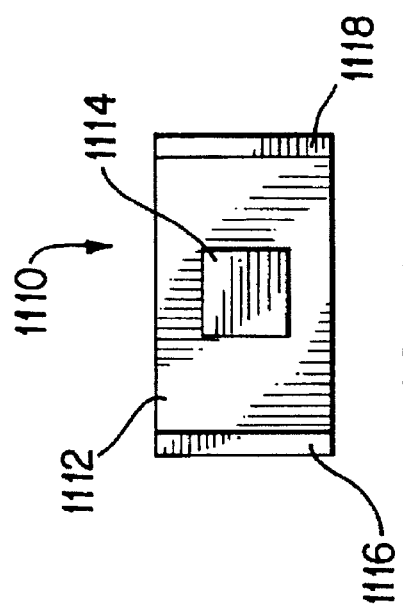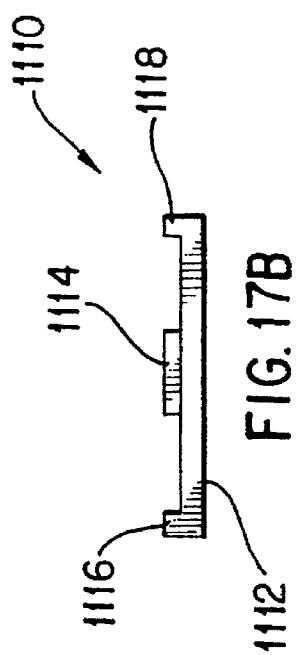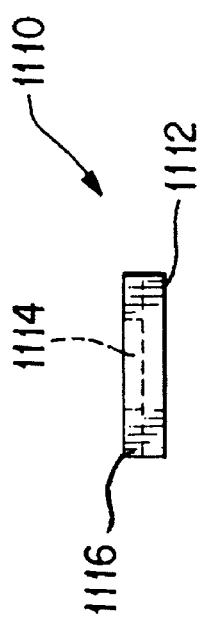

SMALL FORM FACTOR POWER SUPPLY

RELATED APPLICATIONS

This application is a continuation-in-part of provisional application Ser. No. 60/002,488 filed Aug. 17, 1995, and a continuation-in-part application of utility application Ser. No. 08/233,121 filed Apr. 26, 1994, now U.S. Pat. No. 5,479,331.

NOTICE OF COPYRIGHTS

A portion of the disclosure of this patent document contains material which is subject to copyright protection. The copyright owner has no objection to the facsimile reproduction by anyone of the patent disclosure, as it appears in the United States Patent and Trademark Office patent files or records, but otherwise reserves all copyright rights whatsoever.

BACKGROUND OF THE INVENTION

1. Field of the Invention

This invention relates to power supplies and in particular relates to small form factor power supplies.

2. Background of the Invention

Prior art power supplies include a variety of techniques, particularly those used for powering microelectronics such as the class of computers commonly known as "notebook" computers such as the Powerbook Series available from Apple Computer of Cupertino Calif. and the Thinkpad Series available from International Business Machines of Armonk, N.Y. More recently, even smaller personal computers referred to as "sub-notebooks" have also been developed by various companies such as Hewlett-Packard's Omnibook. The goal of these notebooks and sub-notebooks designs is to reduce the size and weight of the product. Currently, notebooks typically weigh about six pounds and sub-notebooks weigh slightly less than four pounds.

Many of these notebook and sub-notebook computers have a battery that must be recharged. Also, typically the computers are designed to be operated from external power sources such as line current and the electrical power system of automobiles.

To power these computers, the manufacturer typically provides an external power source. The external power source may be a switching power supply that may weigh close to a pound and may be about eight inches long, four inches wide and about four inches high. Smaller power supplies do exist but frequently they lack sufficient power to charge new batteries such as nickel hydride batteries.

Such external power supplies therefore contribute substantial additional weight that the user of the computer must carry with him or her to permit battery charging and/or operation from an electrical socket. Further, the external power supply is bulky and may not be readily carried in typical cases for such notebook and sub-notebook computers. In addition, conventional power supplies often have difficulty providing the necessary power curve to recharge batteries that have been thoroughly discharged.

While it has long been known to be desirable to reduce the size and weight of the power supply, this has not been readily accomplished. Many of the components such as the transformer core are bulky and have significant weight. Further, such power supplies may need to be able to provide DC power of up to seventy-five watts, thereby generating substantial heat. Due to the inherent inefficiencies of power supplies, this results in substantial heat being generated within the power supply. Reduction of the volume, weight and heat are all critical considerations for a power supply in this type of application and cannot be readily accomplished. In particular, it is believed to be desirable to have a package as thin as possible and designed to fit within a standard pocket on a shirt or a standard calculator pocket on a brief case.

SUMMARY OF THE INVENTION

These and other objects are accomplished through novel embodiments of a power supply having a transformer. The primary portion includes a primary rectifier circuit, a controller, first and secondary primary drive circuits each coupled magnetically by a coil to the core and a primary feedback circuit magnetically coupled by a separate core. The secondary portion includes a secondary output circuit magnetically coupled by a coil to the core that provides the regulated DC output and a secondary feedback back circuit magnetically coupled to the second core to provide a signal to the primary feedback circuit.

The controller provides a separate square wave signal to each of the two primary circuits and the phase of the square wave signals may be altered relative to each other as determined by the controller. The secondary circuit is positioned on the core relative to the two primary circuits so that the secondary circuit coil is positioned at a summing point on the core of the first and second primary circuit coils. The DC voltage and current levels produced at the output of the secondary circuit are monitored by the secondary feedback circuit to provide, through a secondary feedback coil and a primary feedback coil, a signal to the controller. The controller alters the phase between the signals driving the two coils to produce the desired output DC voltage and current at the secondary coils. This results in providing a regulated DC power supply with high efficiency.

By mounting all of the components on a printed circuit board using planar or low profile cores and surface mounted integrated circuits, a small form factor power supply can be attained. Given the high efficiency of the conversion and regulation, the system minimizes dissipation of heat permitting the entire power supply to be mounted within a high impact plastic container dimensioned, for example, as a right parallelepiped of approximately 2.85×5.0×0.436 inches, thereby providing a power supply that can readily be carried in a shirt pocket. It should be understood that changes in the overall dimensions may be made without departing from the spirit and scope of the present invention. Making a relatively thin package having relatively large top and bottom surface areas relative to the thickness of the package provides adequate heat dissipation.

Particular embodiments of the present invention utilize an improved transformer core that, by moving the relative position of the transformer legs, maximizes a ratio of the cross-sectional area of the transformer legs to the windings, thereby requiring less windings for the same magnetic coupling. Fewer windings means less area of a layer of a circuit board may be used so that the number of layers on the circuit board may be minimized. The improved transformer core also provides this maximized ratio while maintaining the ratio of the secondary and primary windings at a constant value.

BRIEF DESCRIPTION OF THE FIGURES

FIGS. 12A–12C are a top plan view and two side plan views of a transformer core in accordance with another embodiment of the present invention.

FIGS. 13A–13C are a top plan view and two side plan views of a transformer cap for use with the transformer core shown in FIGS. 12A–12C.

FIGS. 17A–17C are a top plan view and two side plan views of a transformer core in accordance with an alternative embodiment of the present invention.

FIGS. 18A–18C are a top plan view and two side plan views of a transformer cap for use with the transformer core shown in FIGS. 17A–17C.

DETAILED DESCRIPTION OF THE PREFERRED EMBODIMENTS

Figure 1:
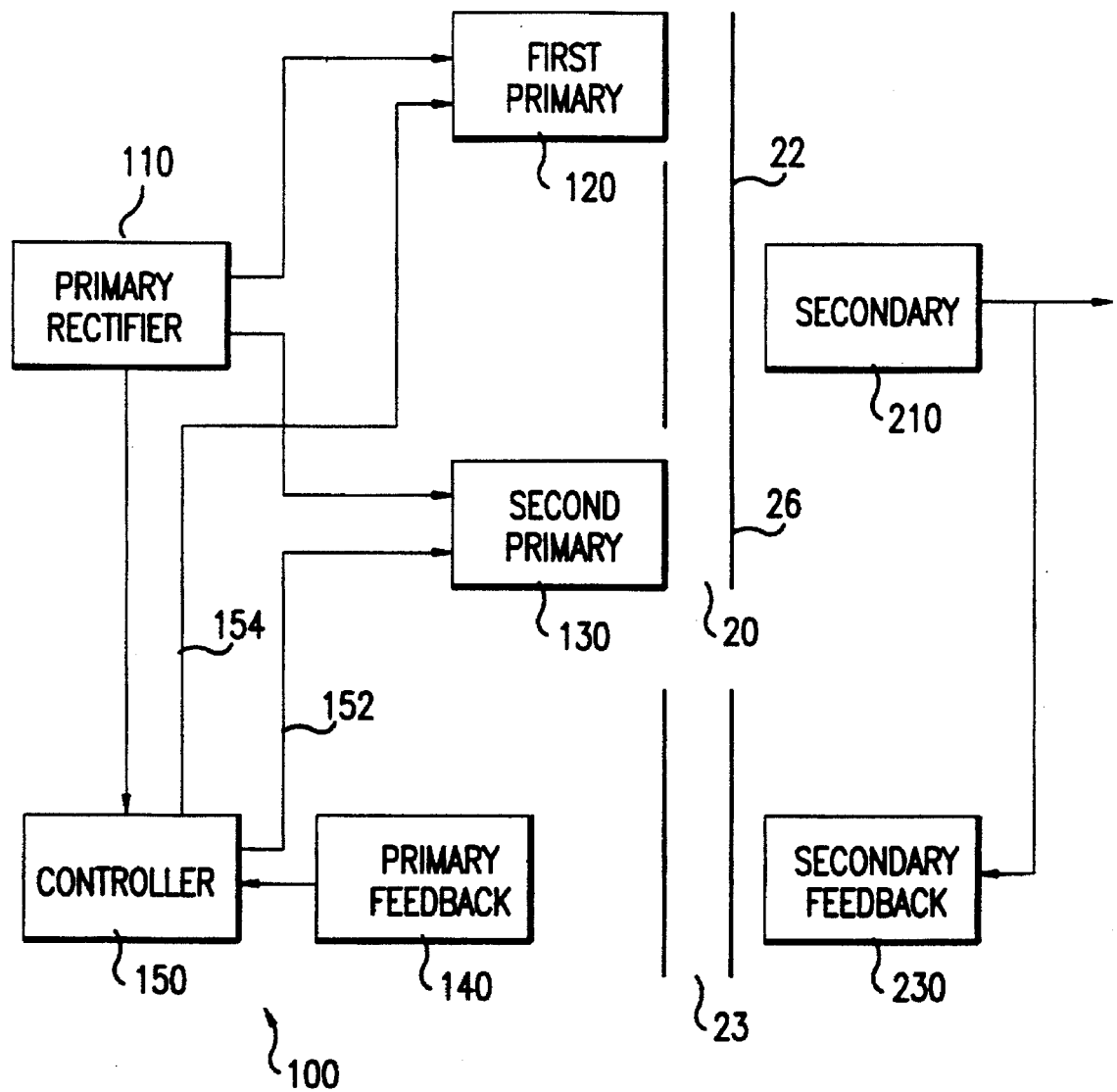
FIG. 1 is a block diagram of a first embodiment of the disclosed invention.

FIG. 1 shows a block diagram of the power supply according to the invention. All components on the left side of a magnetic core 20 are part of the primary portion 100 and all portions on the right hand side are part of the secondary portion 200 of the power supply.

The primary portion 100 includes a primary rectifier and input circuit 110, a first primary and drive circuit 120, a second primary and drive circuit 130, a primary feedback circuit 140 and a controller 150. The secondary portion 200 includes a secondary output circuit 210 and a secondary feedback circuit 240.

The function of the primary rectifier and input circuit 110 is to couple the embodiment 10 to the line voltage (for example 110 volt, 60 Hz), to rectify that voltage and provide DC power for the remainder of the primary portion 100 and a ground path for the primary circuits 120 and 130. The controller 150, which may be a Unitrode 3875 provides two square wave driver signals 152 and 154 having alterable phases to the first and the second primary circuits 120 and 130. The first and second primary circuits are resonant circuits that are resonant at about the frequency of the driver signals and include coils that are coupled to the core 20, which may be a planar or low profile "E" type core, which may be any low loss material, as is shown in a sectional view in FIG. 2. Hence, the driver signals are magnetically coupled to the core 20 by first and second primary coils contained within the circuits 120, 130.

Figure 2:
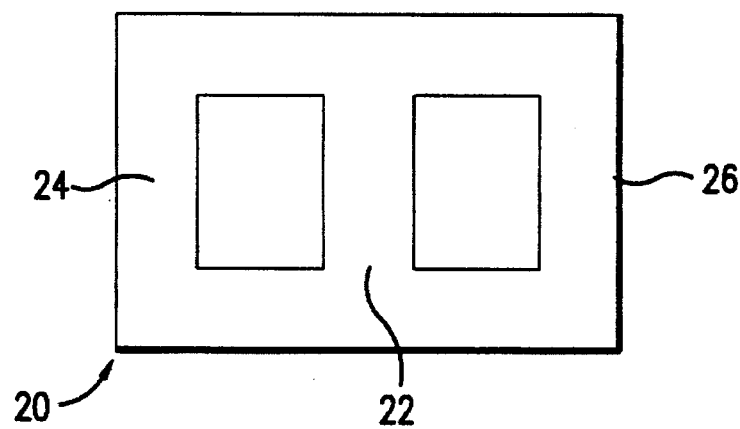
FIG. 2 is a sectional view of the E core for use in the embodiments of FIG. 1.

The coil 212 in the secondary circuit 210 is preferably positioned relative to the coils of the two primary cores so that the coil in the secondary circuit is at a summing point of the magnetic flux from the primary circuit coils. If a planar or low profile "E" type core as shown in FIG. 2 is used, the coil 212 for the secondary circuit 210 is positioned about the central leg 22. The coil for the feedback circuits 140 is positioned on one of the outer legs 24, 26. As a result, the magnetic flux from the two primary coils of the primary circuits 120, 130 are summed at the position where the secondary coil 212 for the secondary circuit 210 is positioned. (This positioning of the coils is shown in FIG. 1 by using the double line to indicate the central leg 22 and a single line to represent the outer legs 24, 26).

The amplitude of the DC voltage and current produced by the secondary circuit 210 are monitored by the secondary feedback circuit 230. The primary feedback circuit 140 and the secondary feedback circuit 230 are magnetically coupled by coils positioned on another core 23 to provide a feedback signal to the controller 150. In response to the feedback signal, the controller alters the relative phase between the two driver signals 152 and 154 to obtain the desired magnitude of the voltage and current. Since the secondary coil 212 is located at a summing point on the core of the flux from the two primary coils, as the phase between the driving signals 152 and 154 to the two primary coils alters, the magnitude of the current and voltage induced in the secondary coil will vary. This will permit control of the secondary circuit 210 output voltage and current, thereby providing a readily controlled output voltage.

Figure 3A:
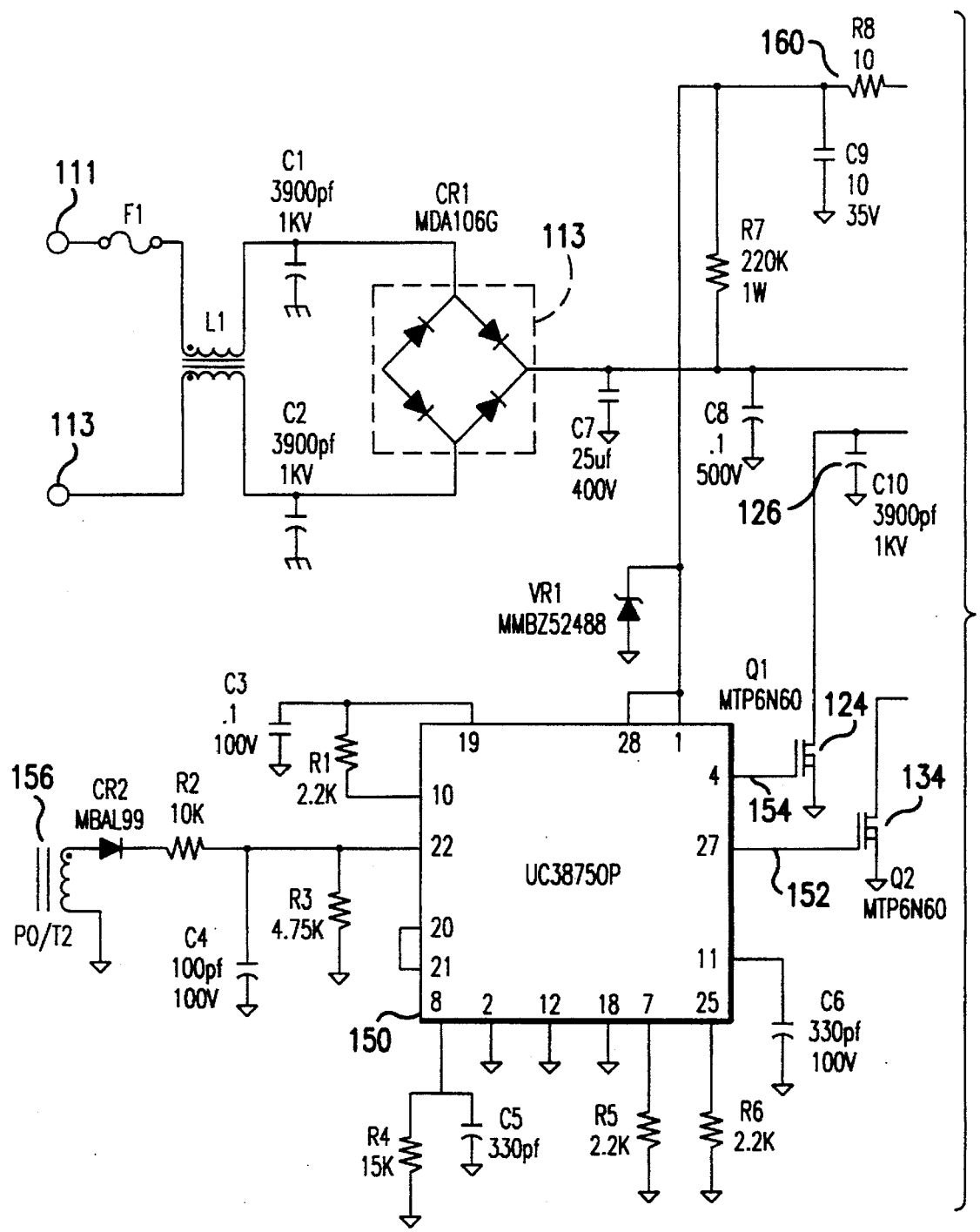
FIG. 3 is a detailed circuit schematic of the embodiment of FIG. 1.
Figure 3B:
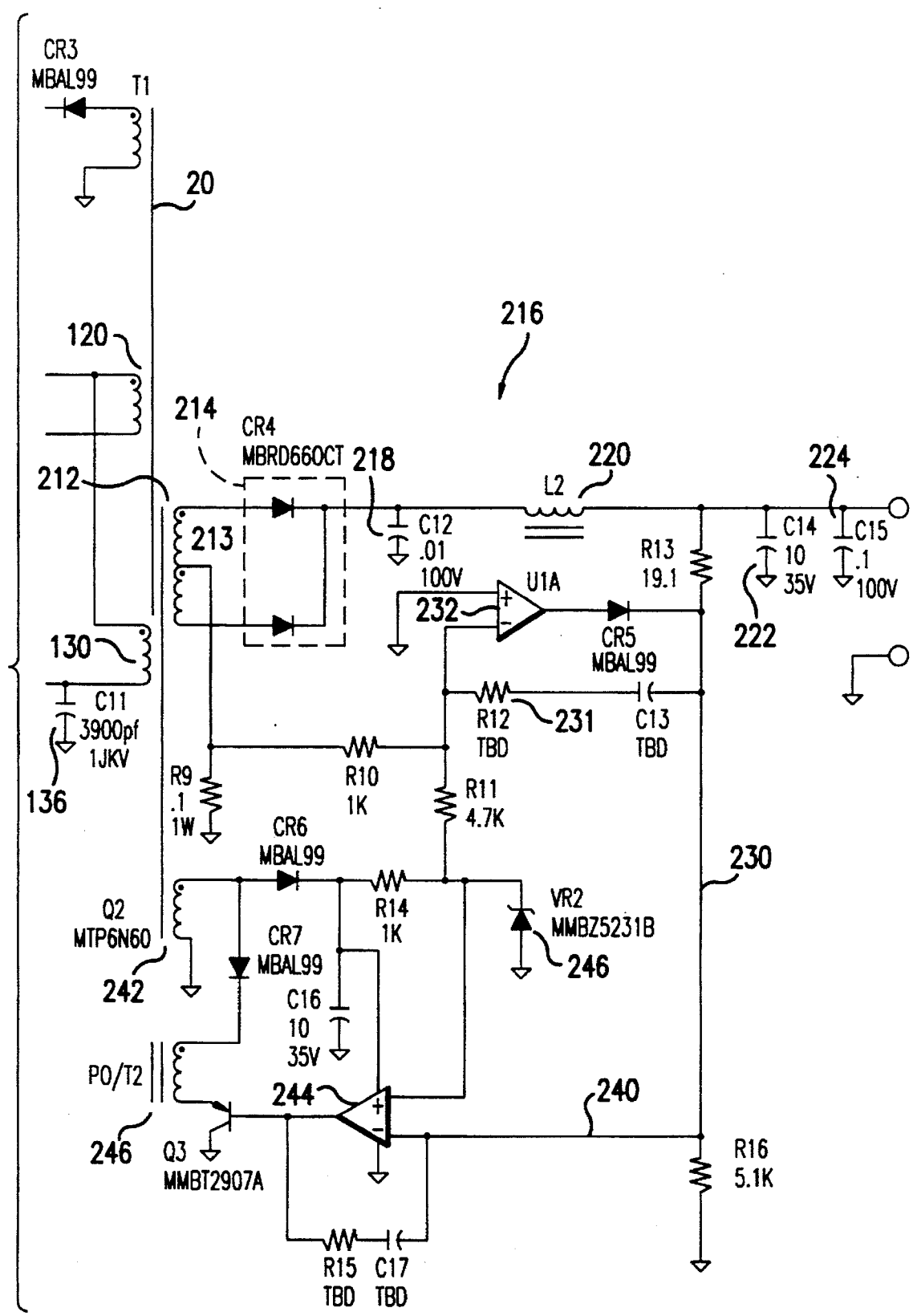

FIG. 3 shows a more detailed schematic of an embodiment of the invention. A standard AC plug may be coupled to input nodes 111, 112 to a first filter coil L1 that is coupled to a full wave rectifier bridge 113, which may be a MDA106G. Filtering capacitors C1, C2, C7, C8 are also coupled to the bridge 113 and one side of the bridge is coupled to AC ground.

The other side of the bridge is coupled to the primary coils 122 and 132 of the first and second primary circuits 120, 130 respectively. The other terminal of the primary coils 122, 132 are coupled to the remainder of the primary circuits 120 and 130. Each of these primary circuits 120, 130 also comprise a drive field effect 124, 134, which may be a MTP6N60 and a capacitor 126, 136. The coils 122, 132, transistors 124, 134 and capacitors 126, 136 are selected so that the resonant frequency of the circuits 120, 130 is at about the frequency of the drive signals 152, 154 to maximize the efficiency of the power supply. In this embodiment, the drive signal frequency is about one megahertz, though other frequencies may be used.

The drive signals 152 and 154 are supplied by a controller 150 such as a Unitrode UC3875QP or other similar product. The controller 150 receives the biasing power at pins 28 and 1 from the primary power supply circuit 160.

Each of the coils 122 and 132 induce a varying magnetic field in the outer legs of the core 20. The secondary coil 212, which has a center tap 213, is coupled to a half wave rectifier bridge 214, which may comprise an MBRD660CT, and then is coupled to a filtering circuit 216 comprised of a capacitor 218, an inductor 220, and capacitors 222 and 224 to provide a DC regulated output 226.

The regulation is provided by feeding back to the controller 150 a signal modulated by a current sensing circuit 232 and a voltage sensing circuit 240 comprising the feedback circuit 230. To provide the carrier for modulation, a further secondary carrier coil 242 is coupled to one of the outer legs of the core 20. One of the legs of this transformer coil 242 is coupled to an isolation feedback transformer T2.

The current sensing circuit takes the output of the center tap of the secondary coil 21 2 and provides a voltage drop across resistor R9 that is provided to a compressing circuit 234. The output of the compressing circuit 234 is added to a voltage dropped across R13 and is provided to an amplifier 244 in the voltage sensing circuit 240. The other input in the voltage sensing circuit is a reference voltage developed by the zener reference diode 246 and also provided as a biasing level to the compressing circuit 234. The output of the amplifier 244 is provided to the base of bipolar transistor Q3, which may be a MMBT2907T, configured in a common base configuration, to amplitude modulate the current through the secondary side coil 246.

The primary side coil 156 of feedback transformer T2 is magnetically coupled to the secondary side coil of 246 and generates an amplitude modulated signal that is envelope detected and integrated to provide a feedback voltage at input 22 of the controller 150.

As a result, as the amplitude of the envelope of the modulated signal increases, the voltage at input 22 of the controller 150 increases. When the controller 150 determines that the voltage has exceeded a predetermined limit, indicating that either the current or voltage at the output has increased beyond the predetermined maximum, the relative phase difference of driver signals 152 and 154 is increased. If the amplitude at input 22 decreases below a predetermined threshold indicating that the voltage or the current is below the desired levels, the relative phase of signals 152 and 154 is decreased towards zero to increase the voltage or current. Due to the summing effect of the magnetic flux at secondary coil 212, a highly efficient control or regulation of the power supply circuit is obtained.

Figure 4:
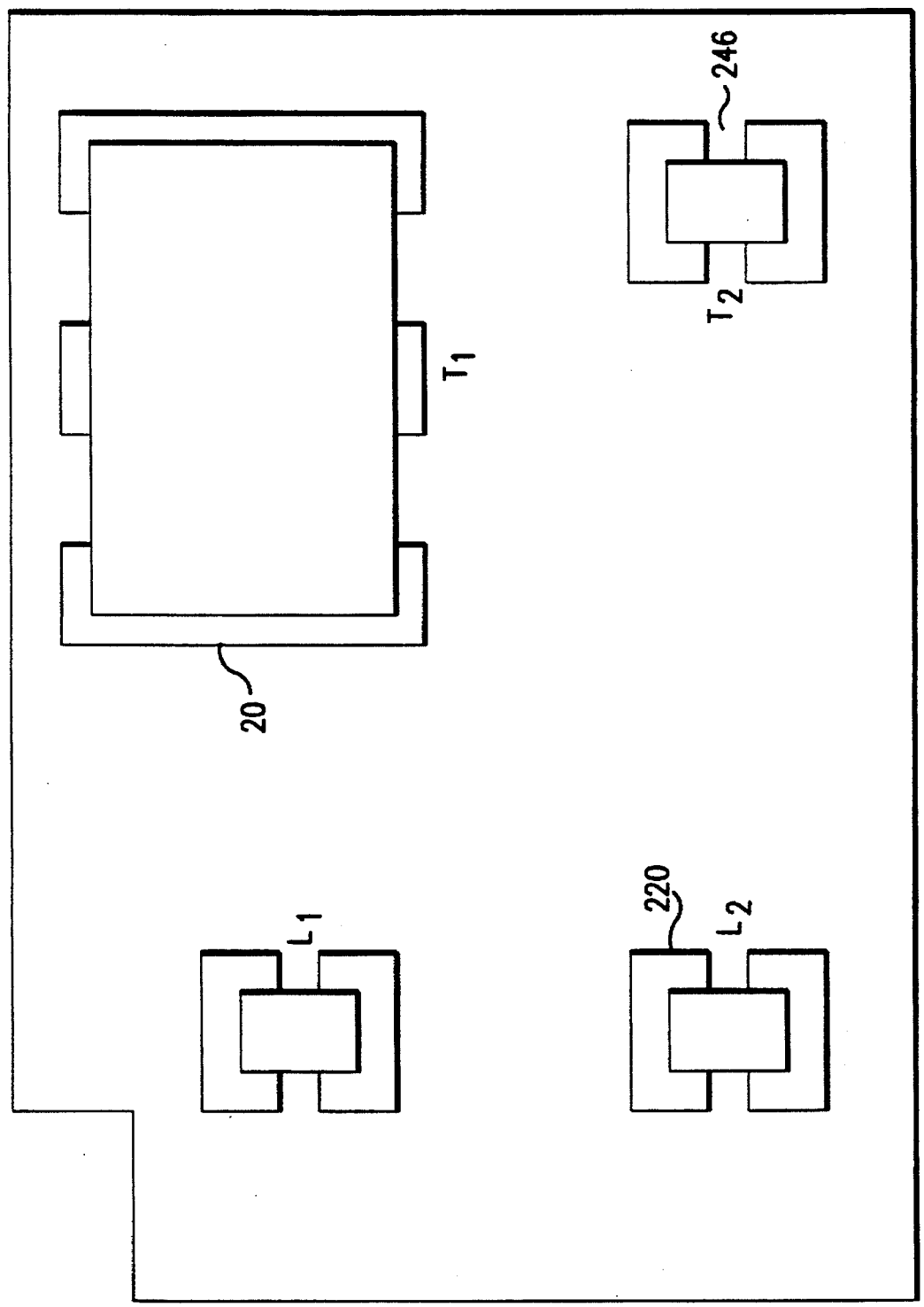
FIG. 4 is a top planar view of a printed circuit board containing the circuit of FIG. 3.

Because of the high efficiency that is attained with this circuit, heat dissipation is much less and it is possible to reduce the size of power supply to a much smaller form factor. In particular, each of the electrical components in FIG. 2, other than the transformer, may be mounted using surface mount devices on a printed circuit board. Further, each of the inductors and transformer cores are low profile or planar cores mounted through cutouts formed in the printed circuit board. The coils of the inductors and transformers are provided by wiring traces on the circuit board that wrap around the portion of the appropriate core penetrating the circuit board. As a result, an extremely compact form factor may be obtained. FIG. 4 shows a top planar view of such a printed circuit board with each inductor L1, L2 and transformer cores T1 and T2 identified.

Notwithstanding the smaller size of the form factor, heat dissipation is not a serious problem due to the increased efficiency of the power supply according to the disclosed embodiments. Therefore, with all the components assembled on a printed circuit board as described above, the assembled printed circuit board may be housed within a housing formed from an injection molded plastic dimensioned 2.75×4.5×0.75 inches without undue heating of the housing, although other dimensions may be used with a key to maintaining a thin profile of the power supply being the ratio of the surface area of the top and bottom surfaces to the overall thickness of the housing. With proper heat sinks, for example, even smaller dimensions may be attained. For example, with such a housing, surface temperatures on the housing should not exceed one hundred twenty degrees Fahrenheit. A normal electrical plug such as a phased, three-prong plug, is coupled by an input cable (not shown) through a hole formed in the housing and an output cable (not shown) having a connector (not shown) coupled to the printed circuit board and to an output connector. Alternatively, the three-prong plug (not shown) may be formed within the housing with the prongs projecting from the housing to avoid the opening for a cable. Also, the plug may be of a pivotable type (not shown) mounted on the surface of the housing and rotate between a recessed position in a cutout formed within the housing and an in use position projecting at ninety degrees from the surface of the housing.

Although the disclosed embodiment shows only one regulated DC voltage being supplied (for example +5 or +16 volts DC), it would readily be understood by those of ordinary skill in the field that other regulated or unregulated voltages may also be supplied with minor modifications to the disclosed embodiment. For unregulated voltages, additional secondary coils (not shown) with the appropriate number of windings to provide the voltage may be magnetically coupled to any of the legs of the transformer core 120. The appropriate circuitry must then be provided for rectifying and filtering the output of this additional secondary coil. Similarly, an additional regulated voltage may be supplied by providing a feedback control circuit such as the type described above that provides the appropriate feedback.

Figure 5:
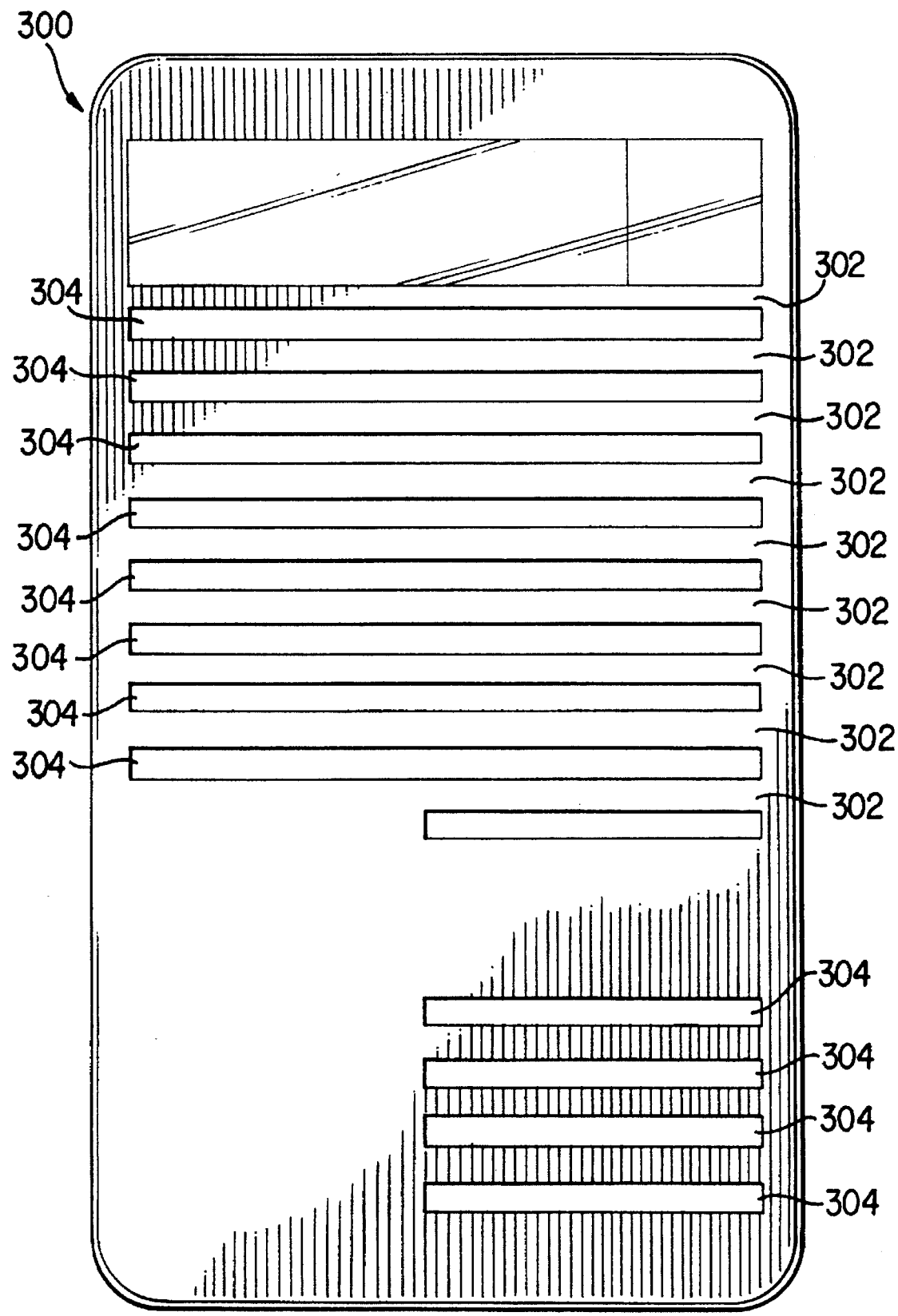
FIG. 5 is a top planar view of a case or housing for an additional embodiment of the for an invention where the case houses the other components.

FIG. 5 shows a top planar view of a case 300 for an additional embodiment of the invention substantially having the shape of a right parallelepiped. The case may have dimensions of 5 inches long by 2.85 inches wide and the thickness (not shown) is 0.436 inches. Both the top portion of the case 300 and the bottom portion (not shown) define a number of louvers 304 defining multiple openings 302. The configuration of the openings 302 on both the top and bottom (not shown) portions of the cover are relatively unimportant. These openings must, however provide sufficient air circulation so that even when operating at maximum rated output power such as seventy-five watts DC, the surface temperature of the case 300 is less than one hundred and forty degrees Fahrenheit and preferably less than one hundred and twenty degrees Fahrenheit when the unit is operated at the maximum rated power of, for example seventy five watts DC. Having the openings defined on both the top and the bottom permits the user to operate the power supply in both the "right side up" and the "upside down" position with adequate air circulation. The case may be made of any high impact suitable plastics, such as Lexan or ABF, and when the top and bottom portions are assembled together such as by a snap lock or a force fit, they define a chamber in which all of the components are housed. Also, the exact dimensions are not critical, but preferably, the ratio of the top and bottom surface areas should be much greater than the thickness.

Figure 6:
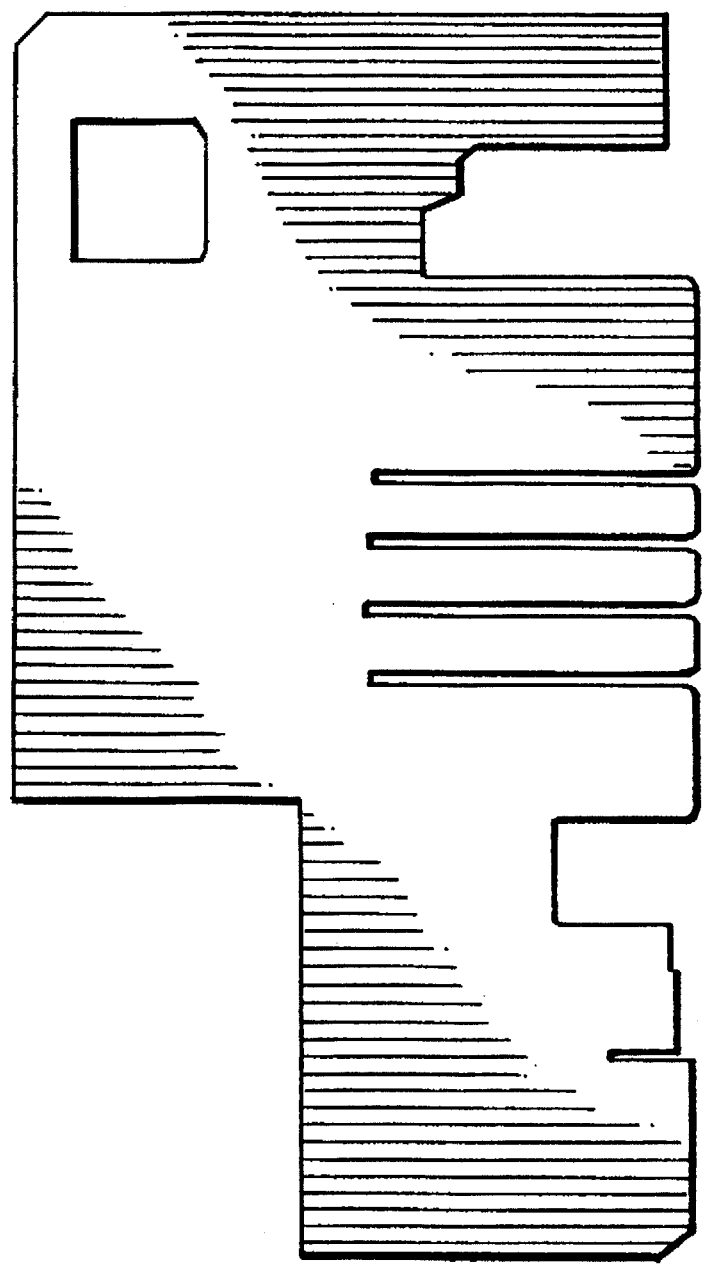
FIG. 6 is a top planar view of one of two heat sinks for the additional embodiment of the invention that sandwich a printed circuit board containing the circuitry for the additional embodiment.

In an assembled unit, immediately beneath the top (and above the bottom (not shown)) of the case 300 are heat sinks such as those shown in FIG. 6. Each heat sink, which comprises a thin sheet of thermally conductive material such as aluminum (which may be anodized) is configured preferably to fit precisely within the top or bottom portions of the case and defines a number of cutouts. These cutouts may provide clearance for certain components to be directly cooled by air entering through the openings 304 defined between the louvers 302 or may be provided for clearance of the components mounted on the printed circuit board (not shown). Preferably, whatever pattern of cutouts are formed in the heat sink, the pattern should be positioned so that when the unit is assembled, the heat sink material should provide adequate coverage over the openings in the case 300 to resist penetration of spilled liquids into the assembled unit. This allows the unit to comply with Underwriters Laboratories and other safety standards. Alternatively, the top and bottom heat sinks may cover the entire power supply circuit board (not shown). Of course, other suitable materials besides aluminum may be used for the heat sinks.

Figure 7A:
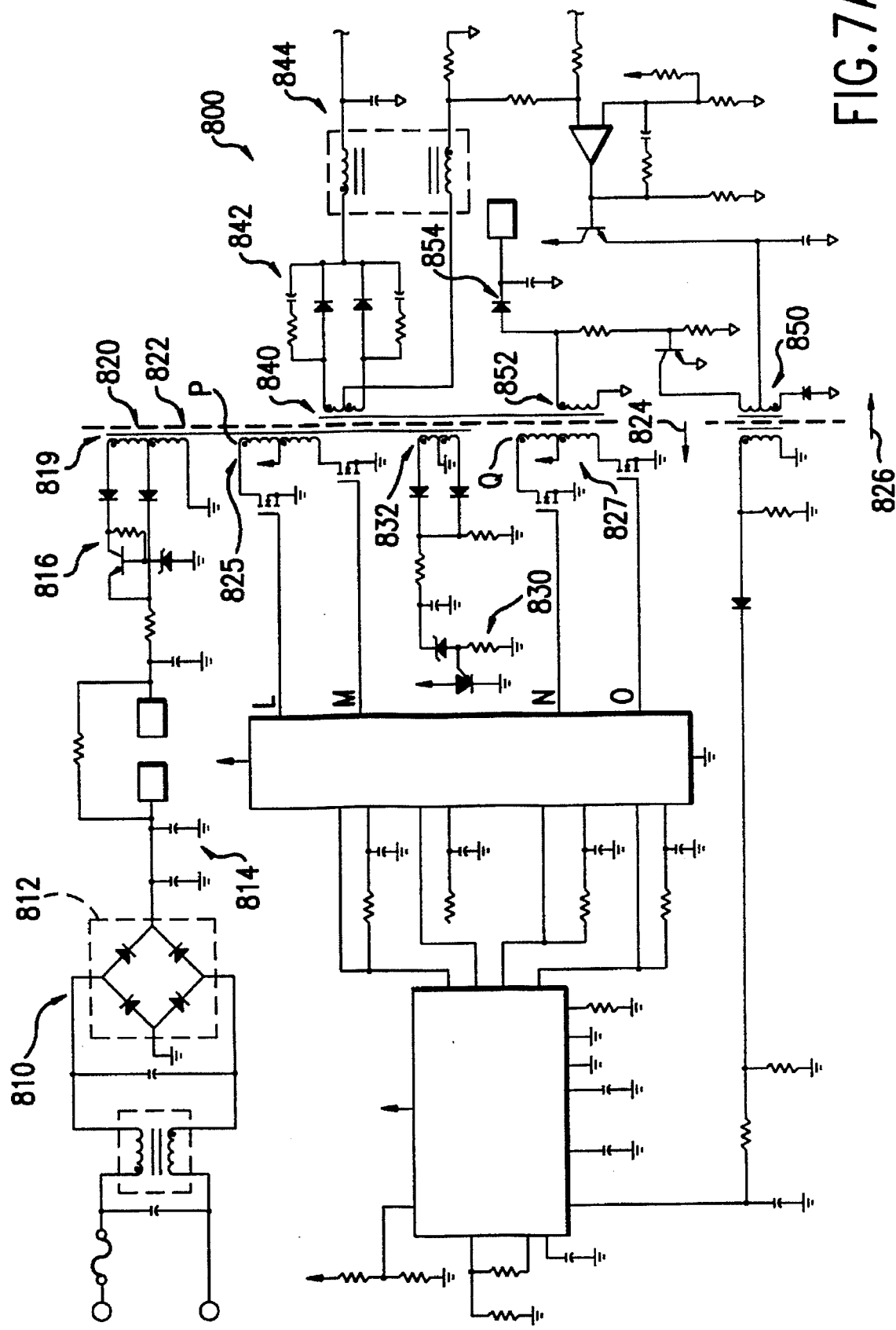
FIG. 7 is a schematic diagram of the additional embodiment of the invention.
Figure 7B:
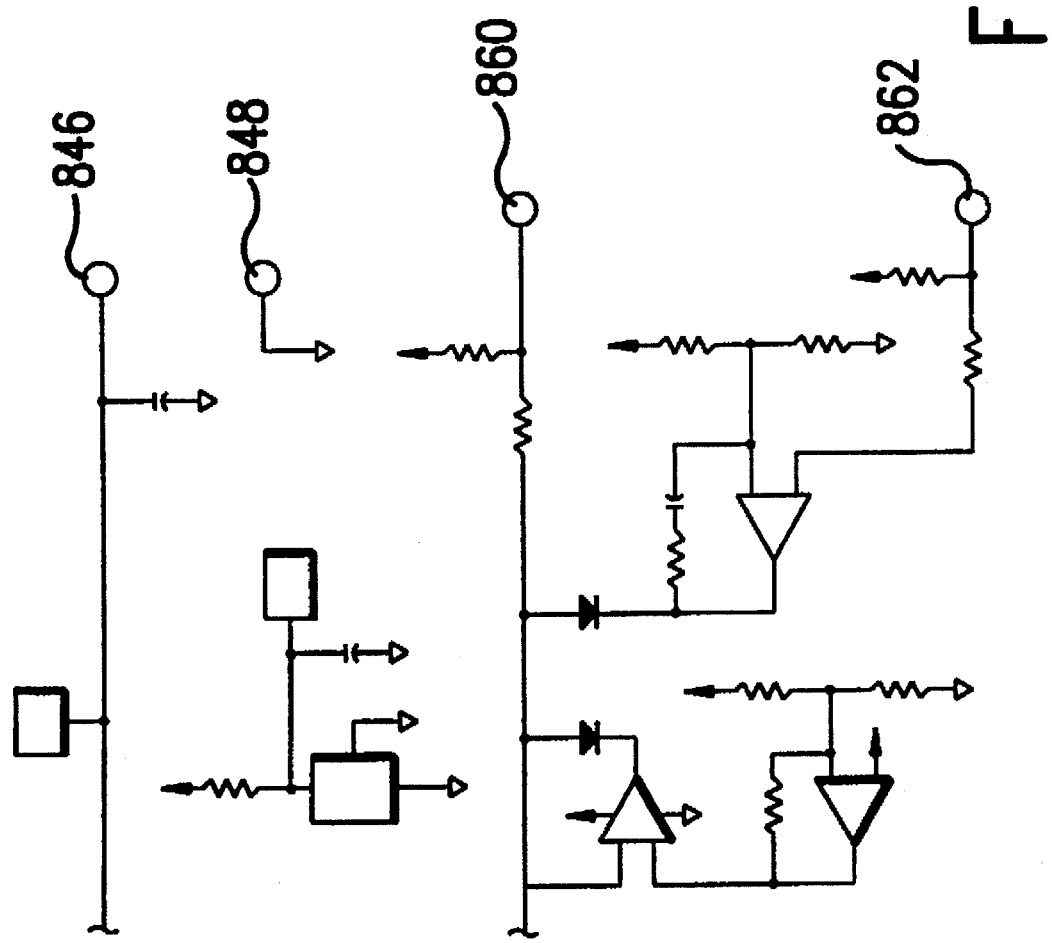

FIG. 7 shows a schematic for the power supply circuit 800 with all resistance in ohms and all capacitance in microfarads unless otherwise labeled. The power supply is formed on a multilayer printed circuit board (not shown) having length and width dimensions that are only slightly smaller than the exterior of the case and fit as precisely as possible within the chamber of the case 300 sandwiched between the heat sinks to minimize movement after assembly. Further, as far as possible, surface mount devices are used to minimize the vertical dimension and all coil cores are preferably planar, low profile cores. Optimally, parts having the smallest possible thickness should be used.

The power supply 800 includes an input circuit 810 that may be coupled to any AC power source preferably having a frequency of between about 50 to 90 hertz and preferably having a voltage of between about 90 to 240 Volts DC. This input circuit 810 may include a full wave bridge rectifier 812, a filter circuit 814 and a regulation circuit 816 to provide an independent power supply for all integrated circuits used on the primary side 824 of the circuit. For filtering purposes, the input regulator circuit 816 may also include a center tapped coil 819 mounted on one of the exterior legs of the "E" planar core 822 of the transformer 820. (Preferably, the planar "E" core of the type shown in FIG. 2 is used.) When the AC input voltage exceeds a predetermined range such as one hundred and forty volts RMS, transistor Q9 in cooperation with zener diode VR1 will cooperate so that the center tap of the coil 819 will be selected. This permits the output Vbias of the regulator to be in an acceptable range for higher input voltages such as may be common outside of the United States. The output Vbias is used for supplying power to all of the internal integrated circuits on the primary side 824 of the transformer 820, namely integrated circuits U1 and U2. This permits these integrated circuits U1, U2 to continue functioning even if the DC output voltage from the power supply 800 drops below the range necessary for the integrated circuits U1 and U2 to continue operating.

A controller integrated circuit U1 provides the four control signals for powering the MOSFETs coupled to the two primary coils 825 and 827 with their center taps coupled to Vbias. The outputs of integrated circuit U1 at pins 7 through 10 provide the control signals to a MOSFET driver circuit U2 such that MOSFETs Q1, Q2, Q4 and Q5 provide the appropriate phase control as is described in connection with FIG. 8. Integrated circuit U2 may be for example a 4468 available from Micrel, Teledyne and Telcom.

Each of power switching MOSFET transistor pairs Q1 and Q2, and Q4 and Q5 are coupled to center tapped primary coils 825 and 827, respectively. These transistors preferably have heat sinks (not shown) coupled to their cases, and/or these heat sinks may also be thermally coupled to one of the heat sinks mounted immediately below and immediately above the top and bottom heat sinks for better thermal control. The capacitance of the MOSFETs Q1, Q2, Q4 and Q5 and the inductance of the coils 825 and 827 are selected to provide resonance at the frequency at which the drive signals are supplied, which may be about 1 MHz. Nonetheless, other frequencies may be used, for example, between a range of about 500 KHz to 2 MHz.

Figure 8:
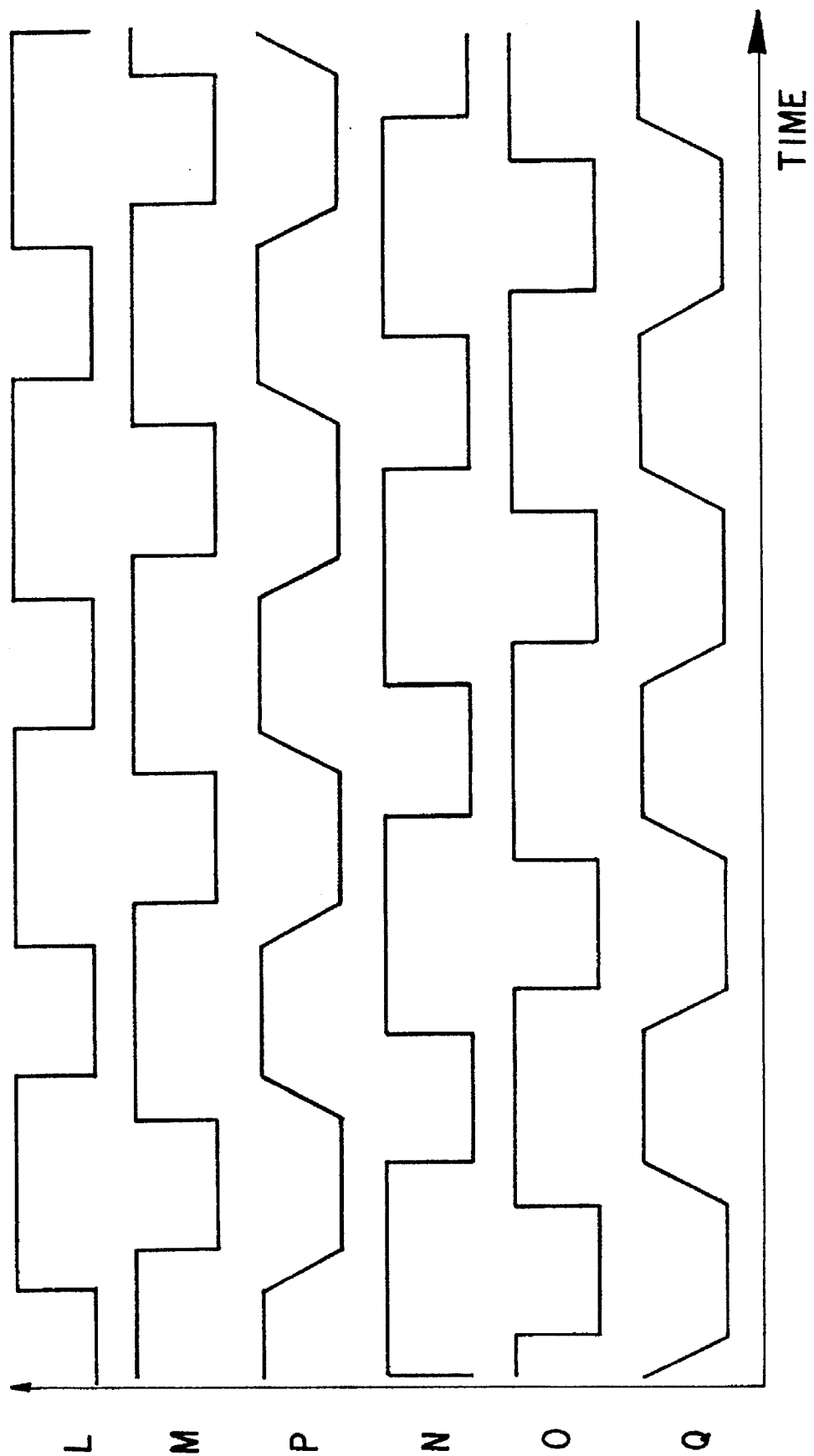
FIG. 8 is a timing diagram for the circuit shown in FIG. 7.

FIG. 8 shows a timing diagram of the signals at nodes L through Q shown on FIG. 7. The integrated circuit U1, as described in more detail below, through feedback, provides MOSFET driving signals L through 0. The MOSFET driving signals provided to each primary winding, 825 and 827 (i.e., L and M for primary winding 825 and N and O for primary winding 827) are always one hundred eighty degrees out of phase as shown in FIG. 8. However, the relative phase relationship of driving signal pair L and M for primary winding 825 with respect to driving signal N and O for primary winding 827 may be changed by the integrated circuit controller U1 in the manner described below to provided the regulated DC output voltage at connectors 846 and 848. Maximum power is provided when the pairs of driving signals are in phase with each other. It should be noted that while the control signal provided at pins 7 through 10 are preferably at substantially a fifty percent duty cycle, the resistors R10 through R13 and the capacitors C10 through C13 combine with the MOSFET circuit U2 to provide preferably driving pulses L through O with a duty cycle of greater than 50 percent. This ensures that the FETS in a pair (i.e., Q1 and Q2 for winding 825 and Q4 and Q5 for winding 827) are never both on at the same time to provide zero resonant switching and reduce power consumption.

Due to the zero volt resonant switching design of the circuit, MOSFET pair Q1 and Q2 are preferably never on the same time and MOSFET pair Q4 and Q5 are preferably never on at the same time. MOSFET Q1 will turn on just about when the voltage at node P, which is at the drain of transistor Q1, reaches a minimum and will turn off immediately after the voltage at the drain of transistor Q1, goes above that minimum level. Similarly, due to the phase relationship of drive signal pair L and M at nodes L and M, transistor Q2 will only be on when the voltage at the drain is almost at the minimum. Transistor Q4 will also only be on when the voltage at node Q is virtually at its minimum and the transistor Q5 will only be on when the voltage at its drain is nearly at its minimum.

It should be noted that the duty cycle of signals L through O is selected so that the waveforms P and Q are substantially trapezoidal with clipping occurring by transistors Q1, Q2, Q4 and Q5. This permits operation of the circuit over a wider range of input voltages. However, in alternative embodiments, transistors Q1, Q2, Q4 and Q5 need not clip so that the waveshapes at the drains of these transistors are substantially sinusoidal. Alternatively, using a low enough frequency for the drive signals, a square wave on the drains of the actual transistors could be used but would probably require larger cores.

For the secondary side 826 of the power supply circuit 800, a single secondary winding 840 is located at the magnetic summing node of the core 822 (i.e., the center leg of the low profile "E" type core shown in FIG. 2). That secondary winding 840 is coupled to a rectifier circuit 842 and then to an output filter 844 including a filter choke L2 to provide the regulated DC output at connectors 846, 848 in the manner described below.

The center tap of the secondary winding 842 is coupled through a coil in the filter coil L2 sharing a common core with the coil in the output filter 844. Through resistor R23, this center tap of winding 842 provides a current sense input to a summing amplifier U3A. A voltage sense of the output DC regulated voltage Vout is provided to an amplifier including amplifier U3C. The sensed voltage signal at the output of amplifier U3C is provided to the summing amplifier U3A through amplifier circuit U3B to provide the feedback necessary for the desired regulation of the DC output.

The output of the summing amplifier U3A is provided through an emitter follower transistor Q7 to the center tap of the secondary side 826 of the feedback transformer 850. This transformer is magnetically isolated from the transformer 820. The signal at the center tap of transformer 850 amplitude modulates a carrier signal provided by winding 852 provided on the same exterior leg of the core 822 as primary winding 827. Preferably also, this should be the opposite exterior leg of the core 822 on which coil 819 and winding 825 are mounted.

The primary side 824 coil of transformer 850 provides an amplitude modulated feedback signal that has an amplitude envelope. A diode detector comprised of diode CR5 and resistor R17 strip the carrier away, leaving the amplitude envelope as a feedback control signal to the VMOD input (pin 1 of U1) provide the feedback useful for altering of the phase relationship between the drive signal pairs of signals L and M on the one hand, and signals N and O, on the other hand to regulate the DC power supply output at connectors 846, 848.

With the current control connector 860 and the voltage control connector 862 left unconnected (as shown), amplifiers comprising U3B and U3D along with the current and voltage sense signals cause the integrated circuit U1 to control the phase relationship between the drive signal pairs L and M, on the one hand, and N and O, on the other hand, to provide a constant power supply until the output voltage drops below about ten volts. Then, due to the feedback signal at pin 1 of the controller U1, the integrated circuit controller U1 controls the relative phase relationship between the pair of drive signals L and M, on the one hand, and N and O, on the other hand, to provide a constant current source down to a minimal voltage, which is preferably less than about one volt.

Figure 11:
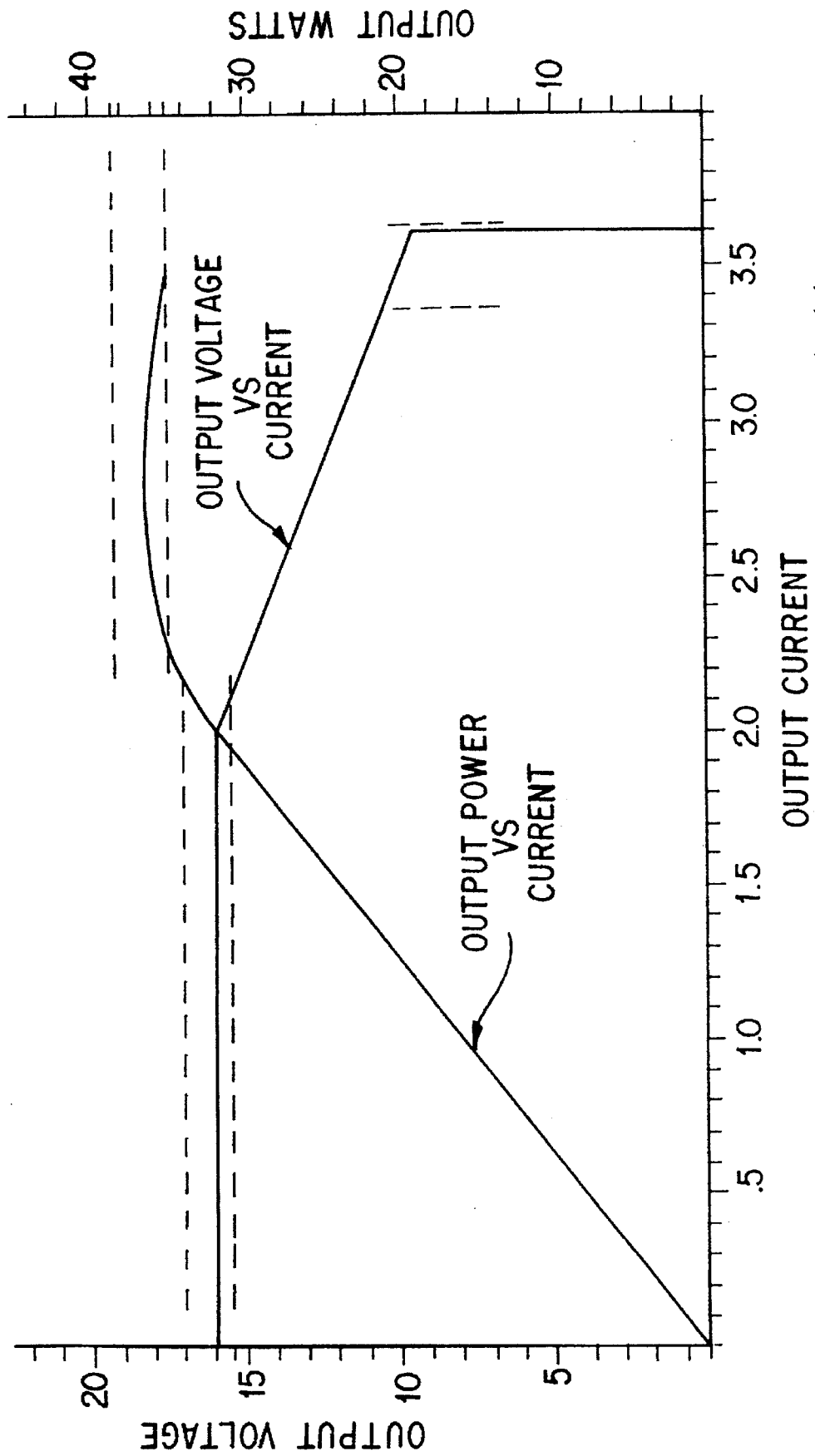
FIG. 11 is a power versus output current curve and an output voltage versus current curve of a power supply in accordance with an embodiment of the present invention.

The applicant has found that this characteristic power and current curve provides good charging of lithium ion, nickel metal hydride, nickel cadmium and other rechargeable batteries. Thus, the small form factor power supply is capable of supplying sufficient power to a personal computer or the like, even when the batteries are thoroughly discharged. The constant current at the output connectors 846, 848 can provide minimal voltages down to about less than one volt because the controller U1 can attain relative phase shifts between the drive signal pairs to between about one degree to one hundred eighty degrees (i.e., signal N lags signal L between about one degree to one hundred eighty degrees and signal O and lags signal M between about one degree and one hundred eighty degrees). Thus, as shown in FIG. 11, if one were to draw a power versus output current curve and an output voltage versus output current curve of such a power supply, the slope of the output voltage curve is relatively constant until the output current reaches approximately 2.0 amperes, then slopes down to 10 volts at which time the output current is essentially constant at approximately 3.6 amperes for voltages under 10 volts. The output power curve increases relatively linearly until the current level reaches approximately 2.2 amperes, at which time the output power curve tends to level off until the current reaches it maximum value of approximately 3.6 amperes. Therefore, the power supply is capable of providing constant current to the personal computer or the like, even if the battery is only capable of producing a fraction of a volt. This power curve is determined as a result of the selected amplifier configuration associated with integrated circuit U3, which may be an LM 324 on the secondary side 826. The predetermined limit may be as high as 75 watts DC for a power supply having an upper and lower surface area within the case 300 of about 14 square inches and a thickness of about 0.436 inches or less so that the ratio of the top or bottom surface areas to the thickness is about 30:1

However, the circuit can readily be programmed to provide other power/current characteristics. This may be accomplished by coupling additional resistors to ground and/or +5 volts (generated by a voltage regulator U4) to the current control and voltage control inputs. Alternatively, the current and voltage control inputs can be coupled through a cable (not shown) to control circuits (not shown) commonly contained within the rechargeable batteries (not shown). These control circuits may contain digital to analog converters that may be coupled to the current and voltage control inputs 860, 862 through a cable coupled to the battery terminals for charging. This would permit the controller in the battery programmatically to regulate the voltage and the current provided at the DC output to minimize recharging time based upon the known characteristics of the battery.

It should also be noted that the Vcc used by the amplifiers U3A through U3D in the integrated circuit U3 and the voltage regulator U4 to generate the +5 volts used in the control circuit (e.g. comprising amplifiers U3B, U3C and U3D) is supplied by a rectifier circuit 854. The rectifier circuit 854 is also coupled to secondary coil 852.

Figure 9:
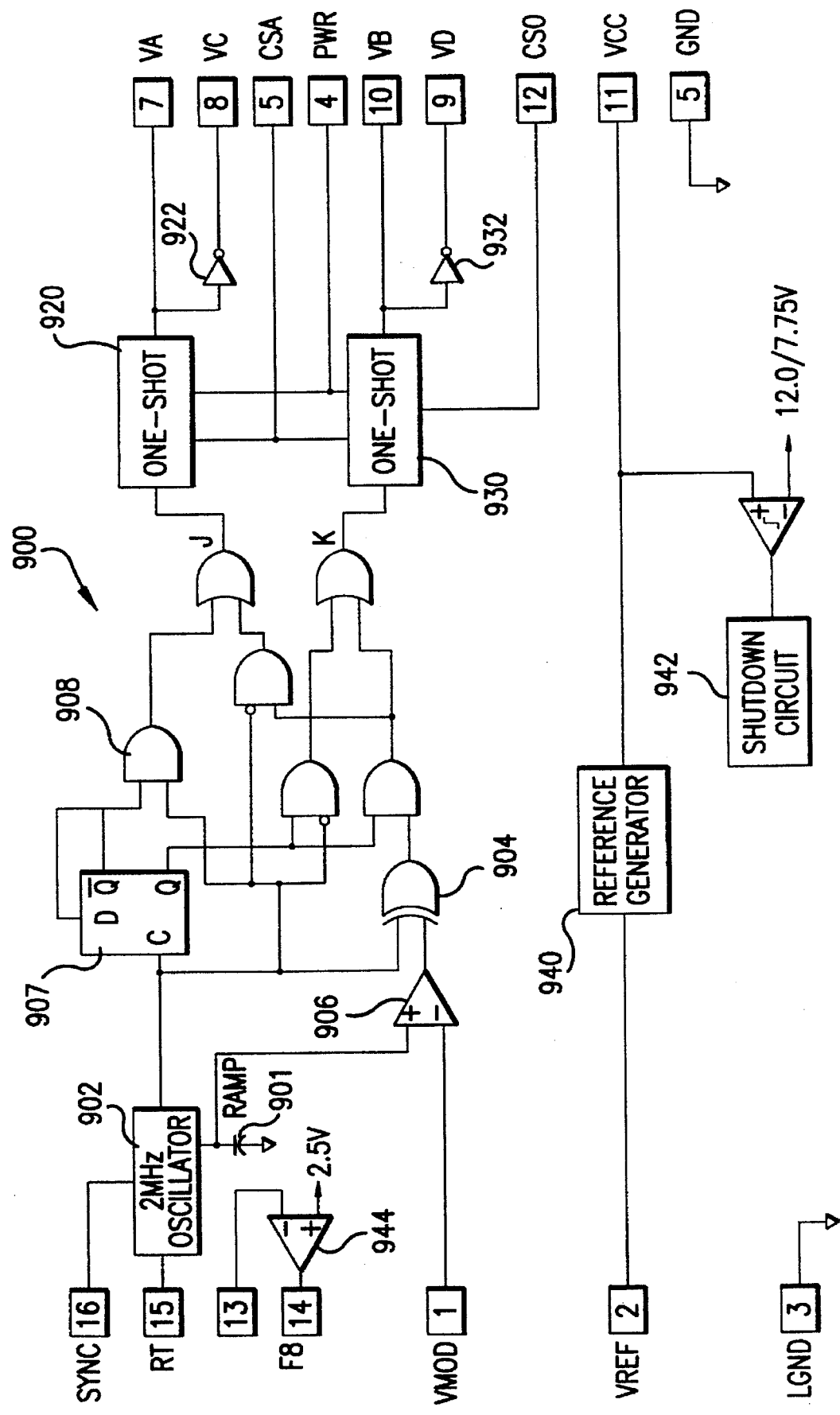
FIG. 9 is a block diagram of the U1 integrated circuit shown in FIG. 7.
Figure 10A:
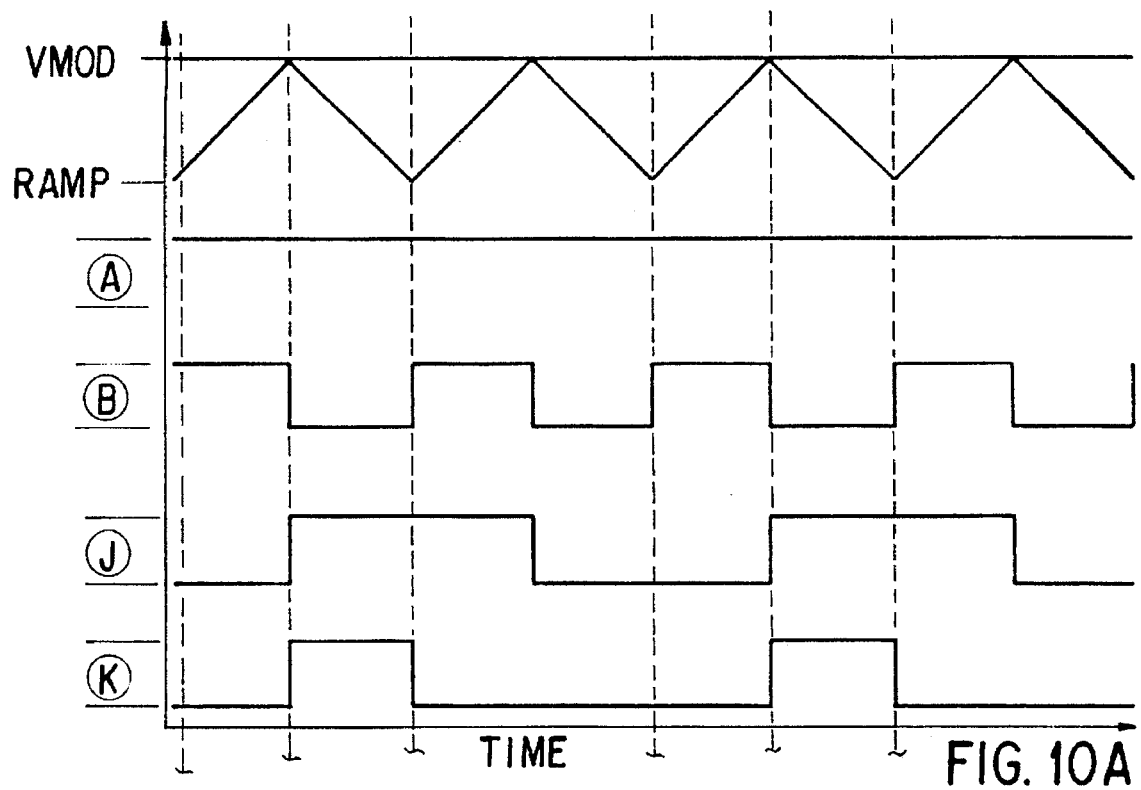
FIGS. 10A and B are timing diagrams for the block diagram shown in FIG. 9.
Figure 10B:
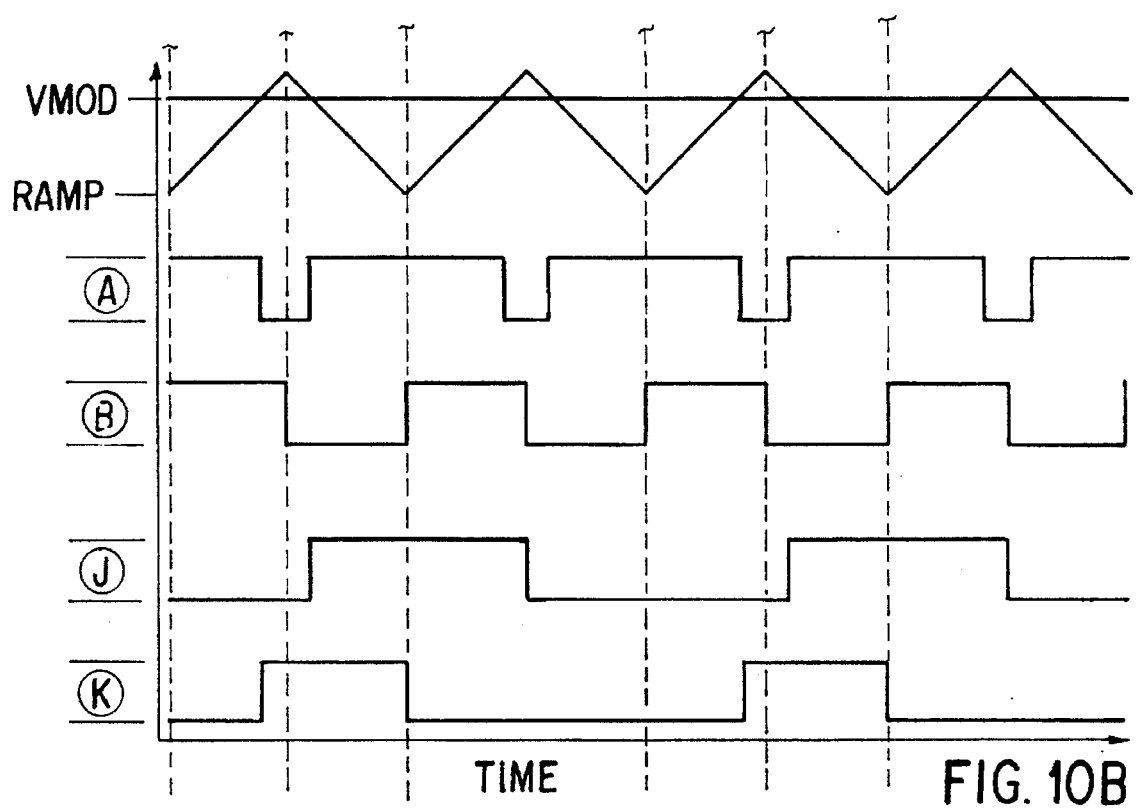

FIG. 9 shows a block diagram 900 of the controller integrated circuit U1. Pins 13, 14, and 15 cooperate together along with external components R3, R4, R5 and R6 to set the operational frequency of the oscillator 902 to be preferably at 2 MHz, although other frequencies may be selected. An output of the oscillator 902 is coupled to an internal capacitor 901 to provide a triangle signal labeled Ramp on FIGS. 10A and 10B while another output of the oscillator 902 is a 2 MHz square wave coupled to exclusive OR gate 904 and the clock input of a D flip flop 907. A Schmitt trigger comparator 906 compares the feedback signal VMOD at pin 1 with the ramp signal as is shown in FIGS. 10A and 10B. In FIG. 10A, the VMOD signal, which is the envelope of the feedback signal from the feedback transformer 850 is at the maximum level, while in FIG. 10B, the VMOD signal is somewhat less than the maximum. As can be seen in FIGS. 10A and 10B, the comparator 906 cooperates with the D flip flop 907, the exclusive OR gate 904, and the associated logic gates 908 to generate one shot control signals J and K. As can be seen by comparing FIGS. 10A, when VMOD is at a maximum, the one shot drive signals J and K are controlled so that both one shot control signals go high at the same time. When the amplitude of VMOD drops below the maximum, the timing of the one shot control signal J is retarded and the timing of the one shot control signal K is advanced. These one shot control signals J and K are provided to one shot circuits 920 and 930 within the controller circuit U1, which have dual outputs VA and VC and VB and VD respectively. The one shots 920 and 930 trigger on the rising edge of signals J and K respectively, and the durations to the falling edge of the control signals J and K are irrelevant provided that they fall before the one shots need to be retriggered. Due to the inclusion of inverters 922 and 932, the output pair of signals VA and VC and VB and VD are approximately one hundred and eighty degrees out of phase. It should also be noted that the external capacitor C7 and resistor R7 are coupled to pins 5 and 4 of the controller U1 to control the duration of the output pulses at the one shot 920 and the one shot 930 to trigger them for the same duration. Further, these component values are selected to be as near as possible to provide a fifty percent duty cycle on the outputs L through O of the MOSFET driver circuit U2 at the frequency of operation.

The controller circuit U1 also includes a reference voltage generator 940 that provides the reference voltage for the over voltage protection circuit 942 and the comparator 944. As shown in FIG. 7, an over voltage protection circuit 830 having a coil 832 is located at or near the summing node of the E block core 822. The value of the components within over voltage protection circuit 830 are selected such that if the output voltage DC Output goes above a predetermined threshold, silicon controlled rectifier (SCR) Q3 will fire, shunting the Vbias to ground. This will cause the integrated circuits U1 and U2 to cease operating, thereby shutting down the output until the unit is recycled by temporarily removing the AC input voltage.

Thus, a small, highly efficient form factor power supply has been disclosed that may be readily mounted within a small container having a thickness of 0.436 inches or less and having dimensions suitable for holding in a typical shirt pocket or calculator pocket in a brief case at high power levels of up to about 75 watts DC output with a surface temperature of about 120 degrees Fahrenheit at the surface. Thicknesses of less than 0.436 inches may be attainable if thinner electrolytic or other types of filtering capacitors can be obtained using standard production techniques. Alternatively, a thinner case may be obtained by maximizing coupling of heat generating components to the heat sinks with maximum air flow through the openings defined by the louvers 302 and by making the top and bottom surface areas of the case larger. Regulation of the output voltage may be readily attained. Still further, the secondary coil can be positioned where the magnetic flux induced in the core from the two primary coils destructively interfere with each other and where the phase of the two driving signals is approximately one hundred eighty degrees out of phase at maximum output. In further alternatives, cooling methods other may be used, such as small electric fans, thermal-electric coolers or the like, to permit smaller form factor power supply configurations. Other alternatives will be readily apparent to those of skill in the art. It should be noted that in alternative embodiments, the various resistors, capacitors, frequencies and inductors may be different and other types of integrated circuits may also be used.

FIGS. 12–16 illustrate an improved transformer core 1010 in accordance with an embodiment of the present invention. FIG. 12A shows a top plan view of the transformer core 1010, which is formed by a base plate 1012, a secondary leg 1014 and a pair of primary legs 1016 and 1018. The secondary leg 1014 and the primary legs of the transformer 1010 may be bosses attached to the base plate 1012 by welds, magnetically permeable adhesives, or the like, or the entire assembly may be molded using magnetically permeable powder. FIG. 12B and 12C show two side plan views of how the transformer legs 1014, 1016, and 1018 are positioned on the base plate. FIG. 13A shows a top plan view of a transformer cap 1020, which is secured to the legs 1014, 1016, and 1018 of the transformer core 1010 to complete the transformer core once the bosses have been inserted through cutouts. The transformer legs 1014, 1016, and 1018 are secured to the transformer cap 1020 by magnetically permeable adhesives, welding or the like. FIGS. 13B and 13C show side plan views of the transformer cap 1020.

In preferred embodiments, the transformer core 1010 and transformer cap 1020 are formed from a ferrite material. The operational frequency range of the core is from about 0.5 to 1.0 MHz. Also, the initial magnetic permeability is preferably 1400±20%. In addition, the saturation flux density may be 5300 gauss, and the Curie temperature may be 250 degrees Centigrade. The core loss while operating at a frequency of 1 MHz should preferably be approximately 500 KW/m at 500 gauss. In other embodiments, different core parameters may be used.

In the disclosed embodiments, the base plate 1012 and the transformer cap are dimensioned to be 1.260×1.260×0.075 inches. The secondary transformer leg 1014 is dimensioned to be 0.800×0.200 by 0.060 inches, and each primary transformer leg is 0.133×0.700×0.060 inches. The secondary transformer leg 1014 is positioned away from the primary transformer legs 1016 and 1018, as shown in FIGS. 12A–12C, to maximize the cross-sectional area of each of the transformer legs (i.e., the length and width of the transformer legs). This maximizes a ratio of the cross-sectional area of the transformer legs to the windings, thereby requiring less windings for the same magnetic coupling. Fewer windings means less area of a layer of a circuit board may be used so that the number of layers on the circuit board may be minimized. The improved transformer core also provides this maximized ratio while maintaining the ratio of the secondary to the primary windings at a constant value. However, in alternative embodiments, slightly different dimensions for the core parts may be used. Also, as described in the previous embodiments, the secondary coil is still positioned at a summing point of the primary coils.

Figure 14:
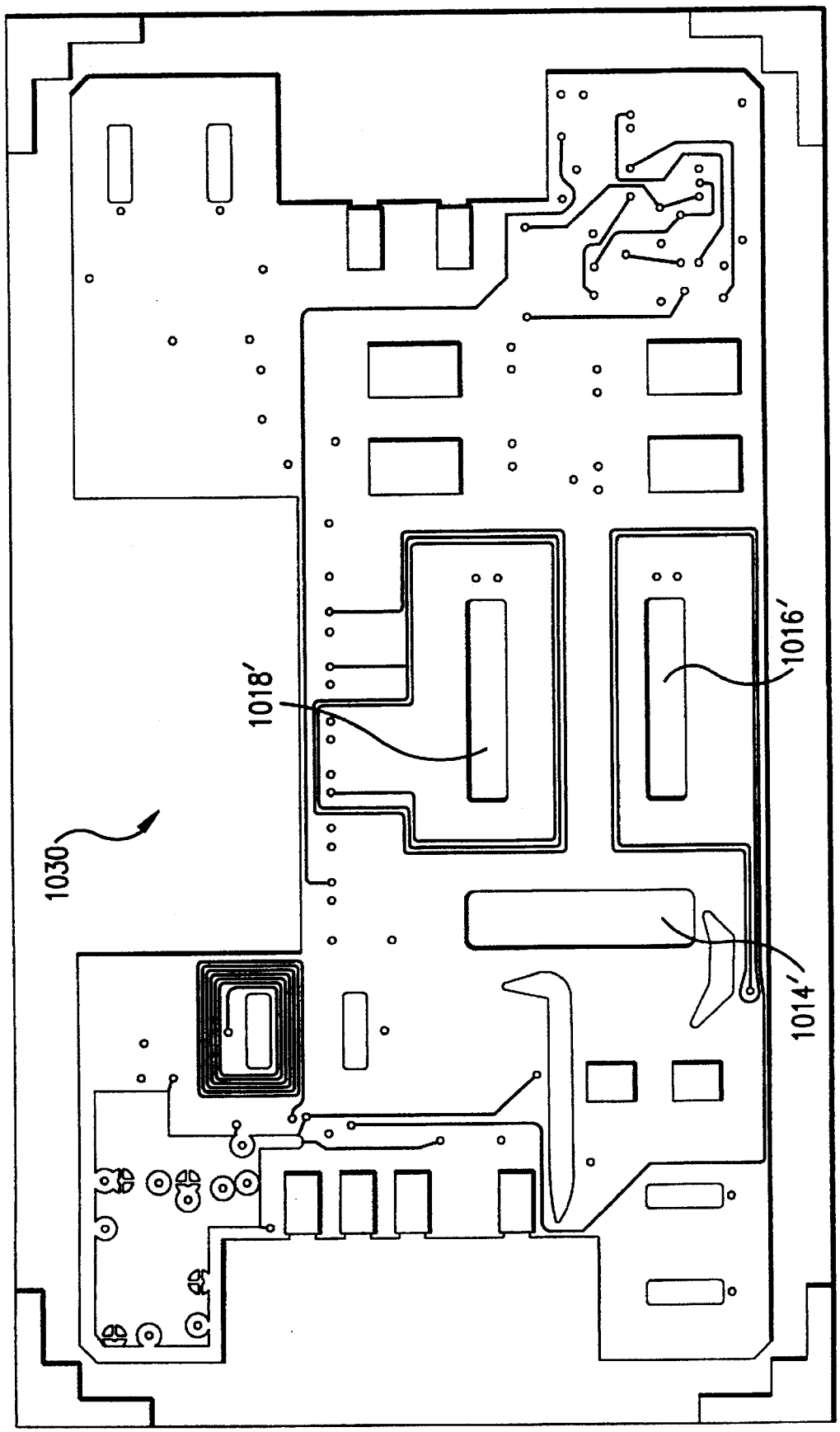
FIG. 14 is a top plan view of a printed circuit board layer, without winding patterns, to be coupled with the transformer core shown in FIGS. 12A–12C.
Figure 15:
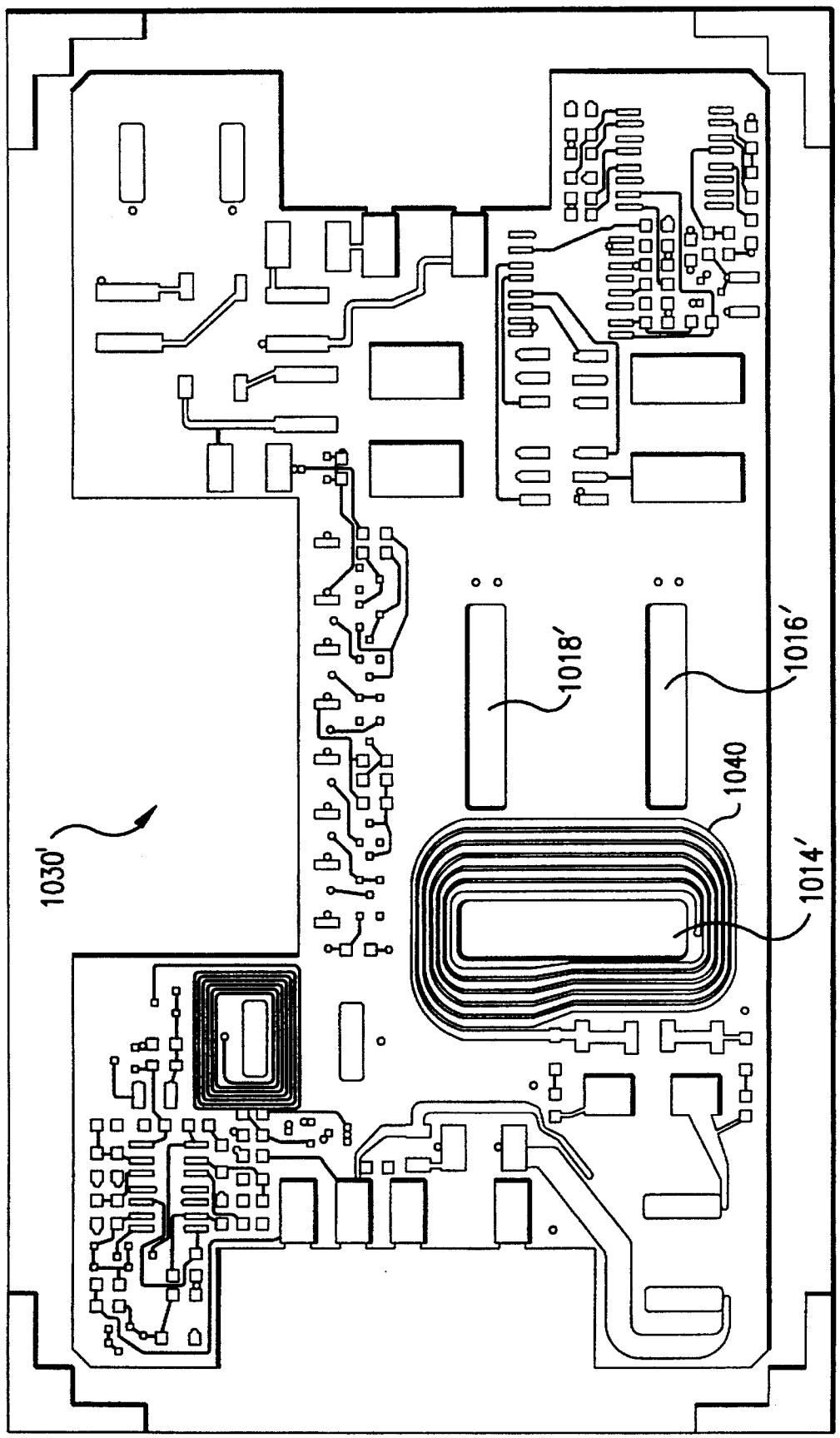
FIG. 15 is a top plan view of another printed circuit board layer showing a secondary winding pattern to be coupled with to the transformer core shown in FIGS. 12A–12C.
Figure 16:
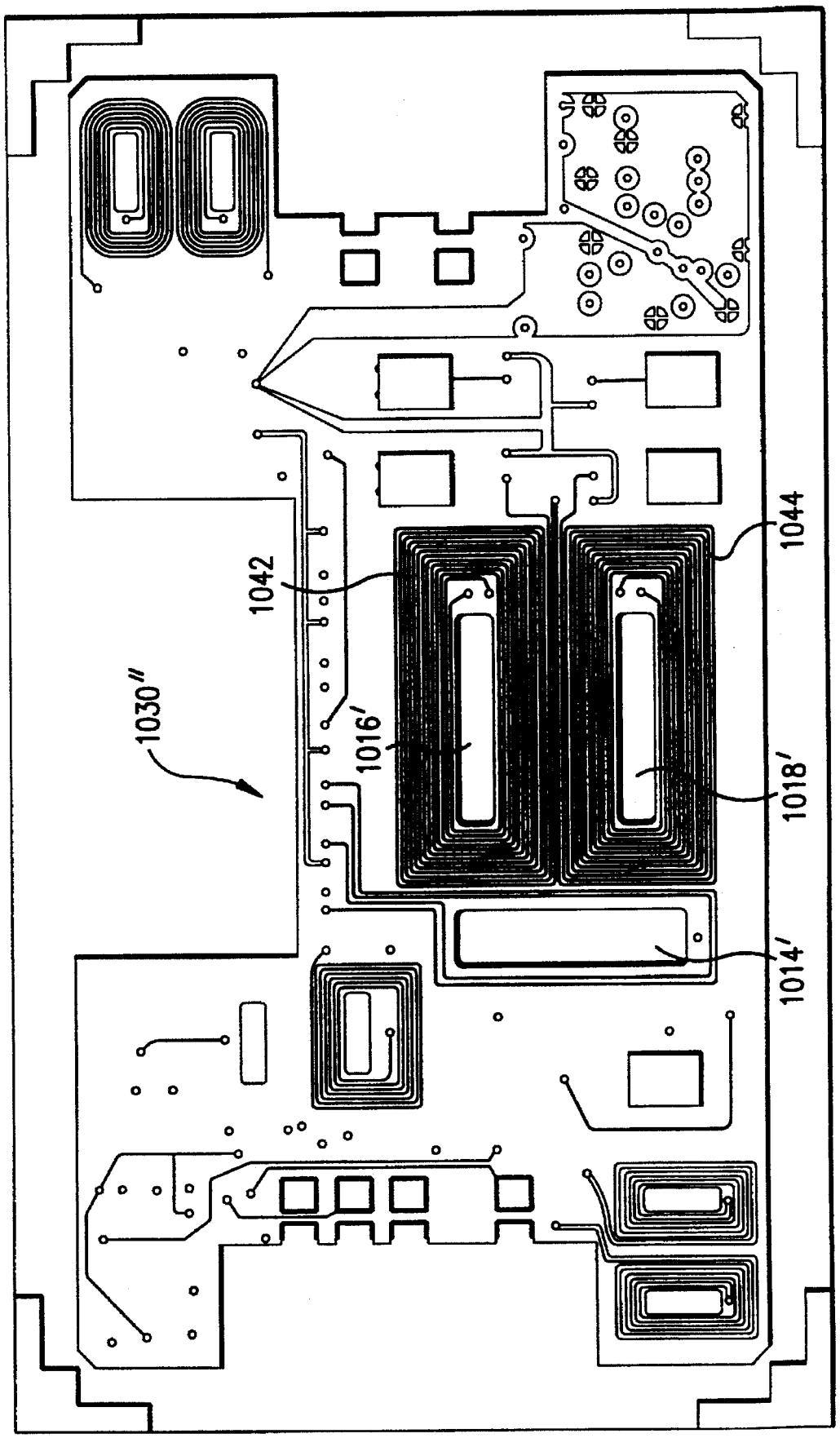
FIG. 16 is a top plan view of another printed circuit board layer showing a primary winding pattern to be coupled with the transformer core shown in FIGS. 12A–12C.

FIG. 14 shows a printed circuit card layer 1030 without secondary or primary cores attached and having cutouts 1014', 1016' and 1018' to allow the corresponding transformer legs 1014, 1016 and 1018 to pass through the printed circuit board. FIG. 15 shows another printed circuit card layer 1030" in which a secondary coil pattern 1040 surrounding the cut-out 1014' for the secondary transformer leg 1014. FIG. 16 shows still another printed circuit card layer 1030' in which primary coil patterns 1042 and 1044 surround the cut-outs 1016' and 1018' for the to primary transformer legs 1016 and 1018, respectively.

FIGS. 17–22 illustrate an alternative embodiment using two transformer cores 1110 in accordance with the present invention. FIG. 17A shows a top plan view of bottom portion of the transformer core 1110, which is formed by a base plate 1112, a central leg 1114 and a pair of peripheral legs 1116 and 1118. The central leg 1114 and the peripheral legs of the transformer 1110 may be bosses attached to the base plate 1112 by welds, magnetically permeable adhesives, or the like, or the entire assembly may be molded using magnetically permeable powder. FIG. 17B and 17C show two side plan views of how the, transformer legs 1114, 1116, and 1118 are positioned on the base plate 1112 FIG. 18A shows a top plan view of a transformer cap 1120, which is secured to the legs 1114, 1116, and 1118 of the transformer core 1110 to complete the transformer core once the bosses have been inserted through cutouts. The transformer legs 1114, 1116, and 1118 are secured to the transformer cap 1120 by magnetically permeable adhesives, welds or the like. FIGS. 18B and 18C show side plan views of the transformer cap 1120.

In preferred embodiments, the transformer core 1110 and transformer cap 1120 are formed from a ferrite material that has properties and characteristics that are similar to those of the embodiment with the transformer core 1010, discussed above.

In the disclosed embodiments, the base plate 1112 and the transformer car 1120 are dimensioned to be 1.113×1.113× 0.075 inches. The central transform leg 1114 is dimensioned to be 0.300×0.300 by 0.060 inches, and each peripheral transformer leg is 0.075×0.630×0.060 inches. The central transformer leg 1114 is positioned away from the peripheral transformer legs 1116 and 1118, as shown in FIGS. 17A–17C, to maximize the cross-sectional area of the central transformer leg 1114 (i.e., the length and width of the central transformer leg). This maximizes a ratio of the cross-sectional area of the central transformer leg 1114 to the windings, thereby requiring less windings for the same magnetic coupling. Fewer windings means less area of a layer of a circuit board may be used so that the number of layers on the circuit board may be minimized. The improved transformer core also provides this maximized ratio while maintaining the ratio of the secondary to the primary windings at a constant value. Also, as described in the previous transformer core 1010 embodiment, the secondary coil still positioned at a summing point of the primary coils.

Figure 19:
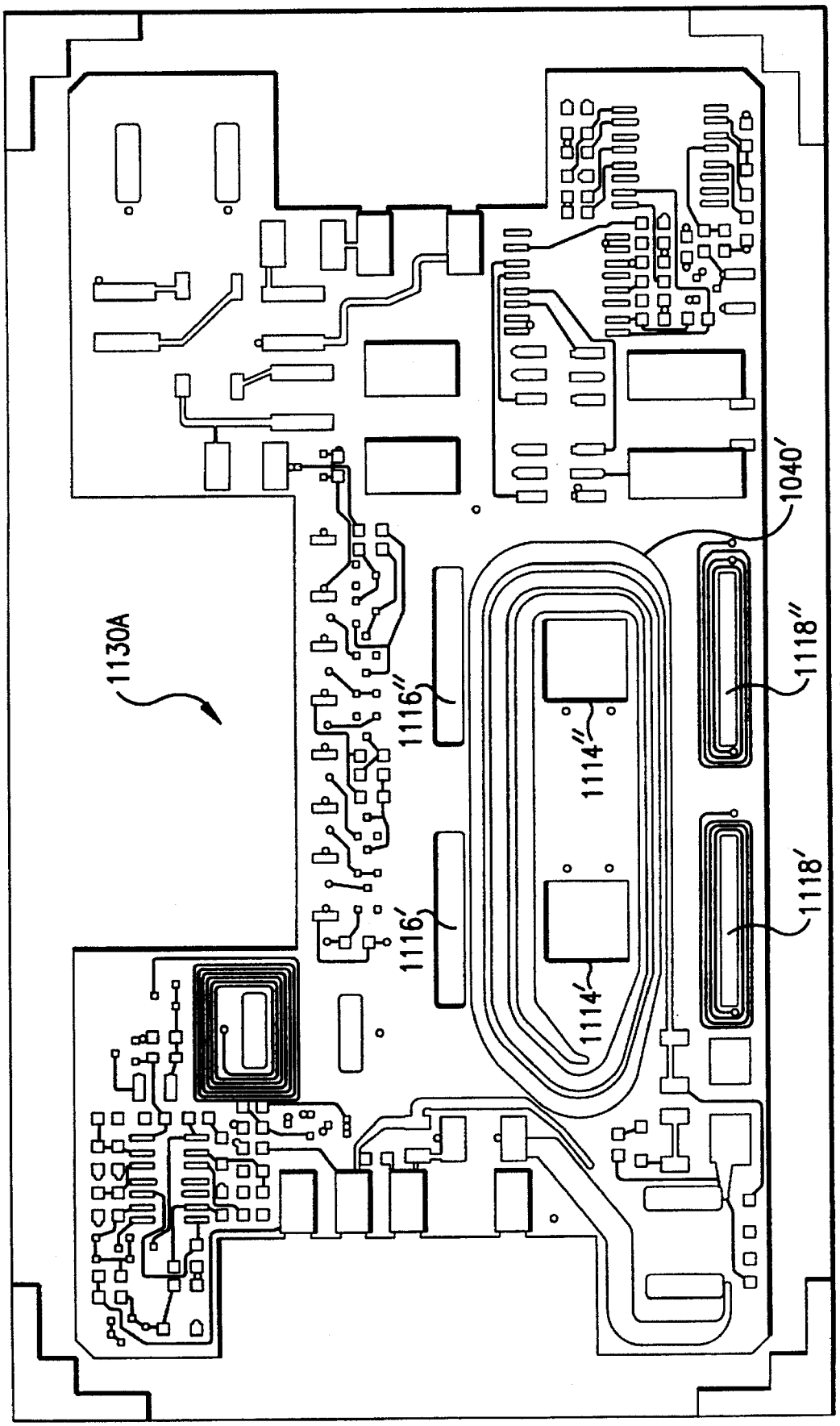
FIG. 19 is a top plan view of a printed circuit board layer with a secondary winding pattern to be coupled with the transformer core shown in FIGS. 17A–17C.
Figure 20:
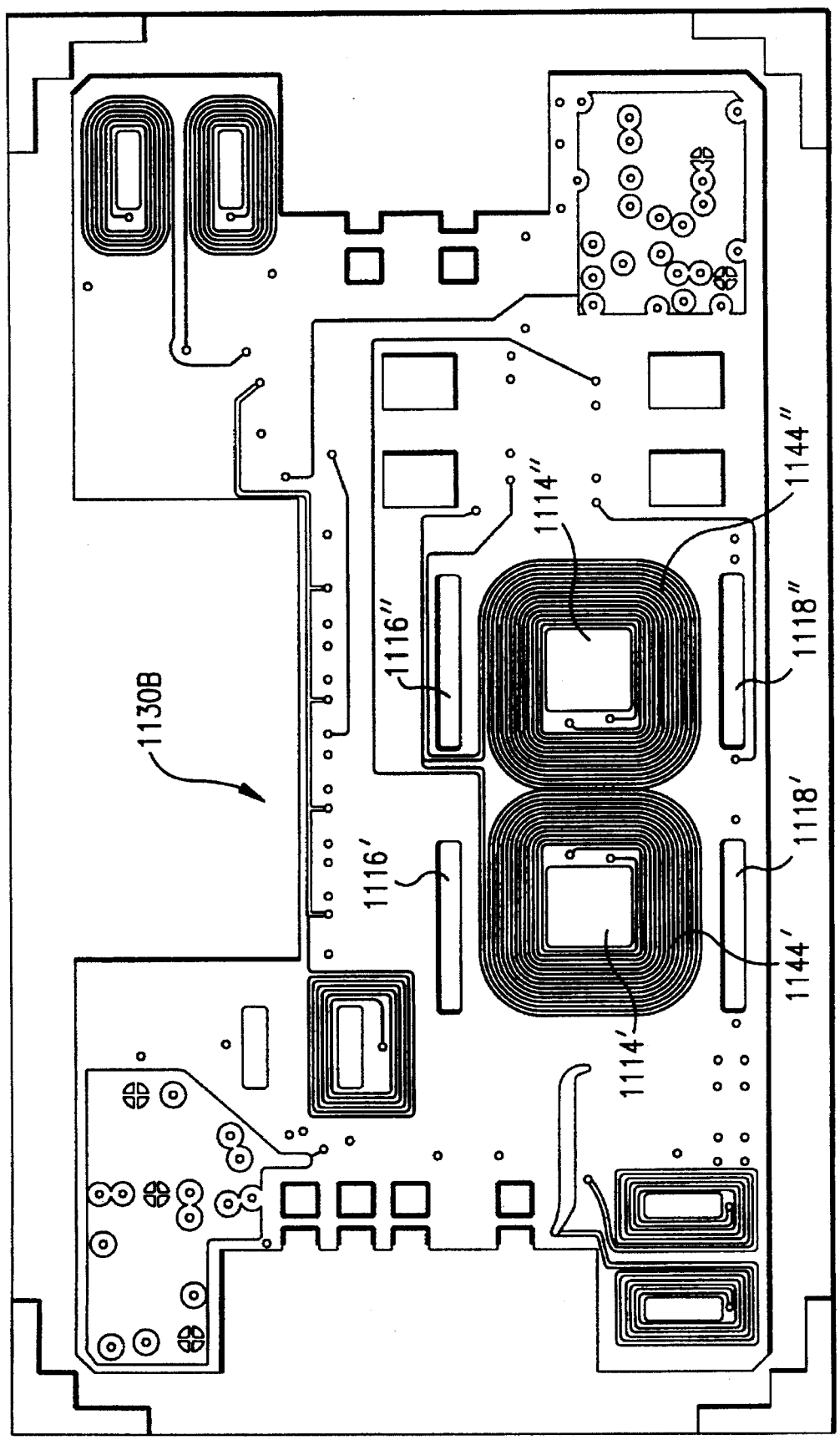
FIG. 20 is a top plan view of another printed circuit board layer showing primary winding patterns to be coupled with the transformer core shown in FIGS. 17A–17C.
Figure 21:
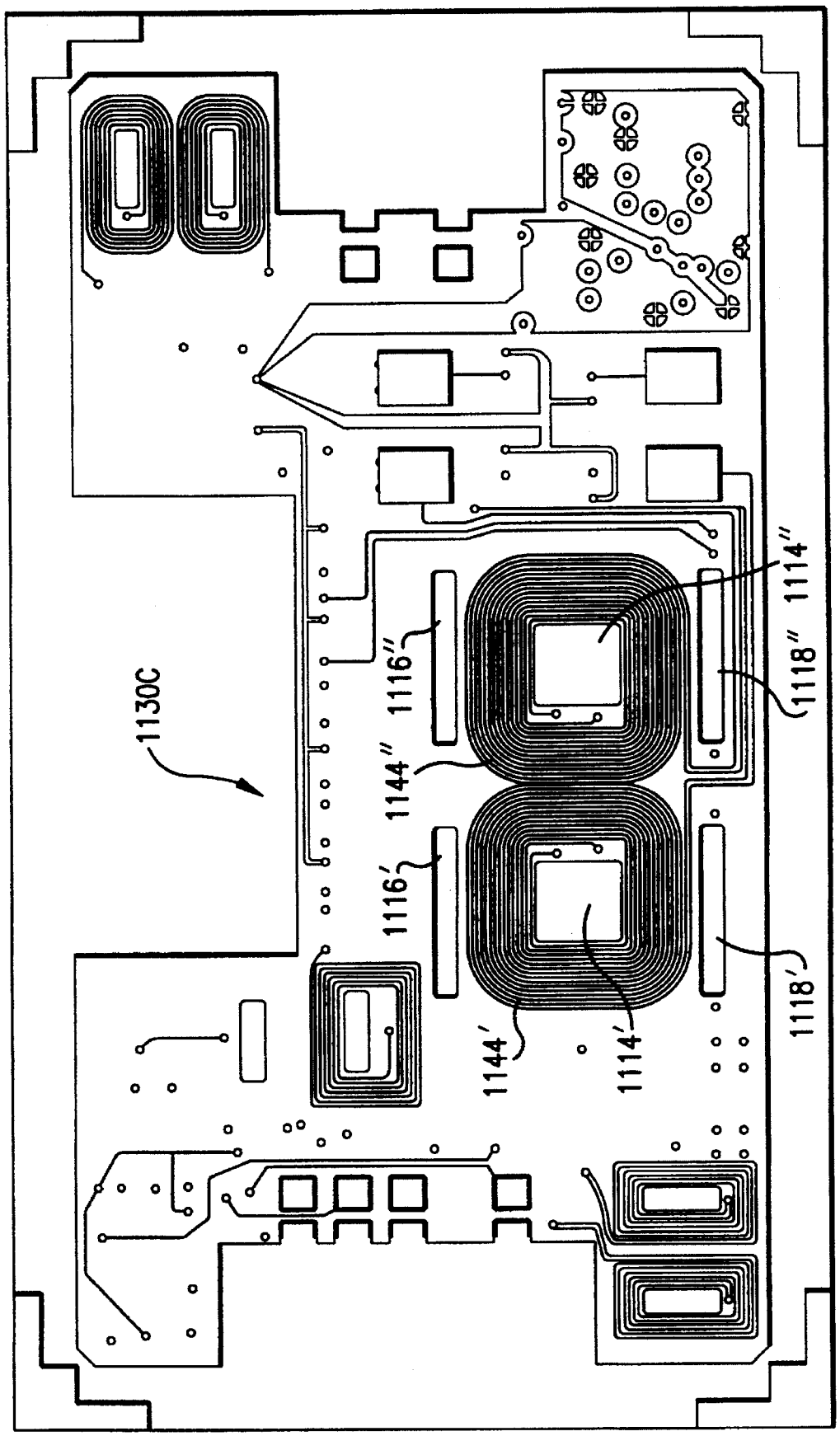
FIG. 21 is a top plan view of another printed circuit board layer showing additional primary winding patterns to be coupled with the transformer core shown in FIGS. 17A–17C.
Figure 22:
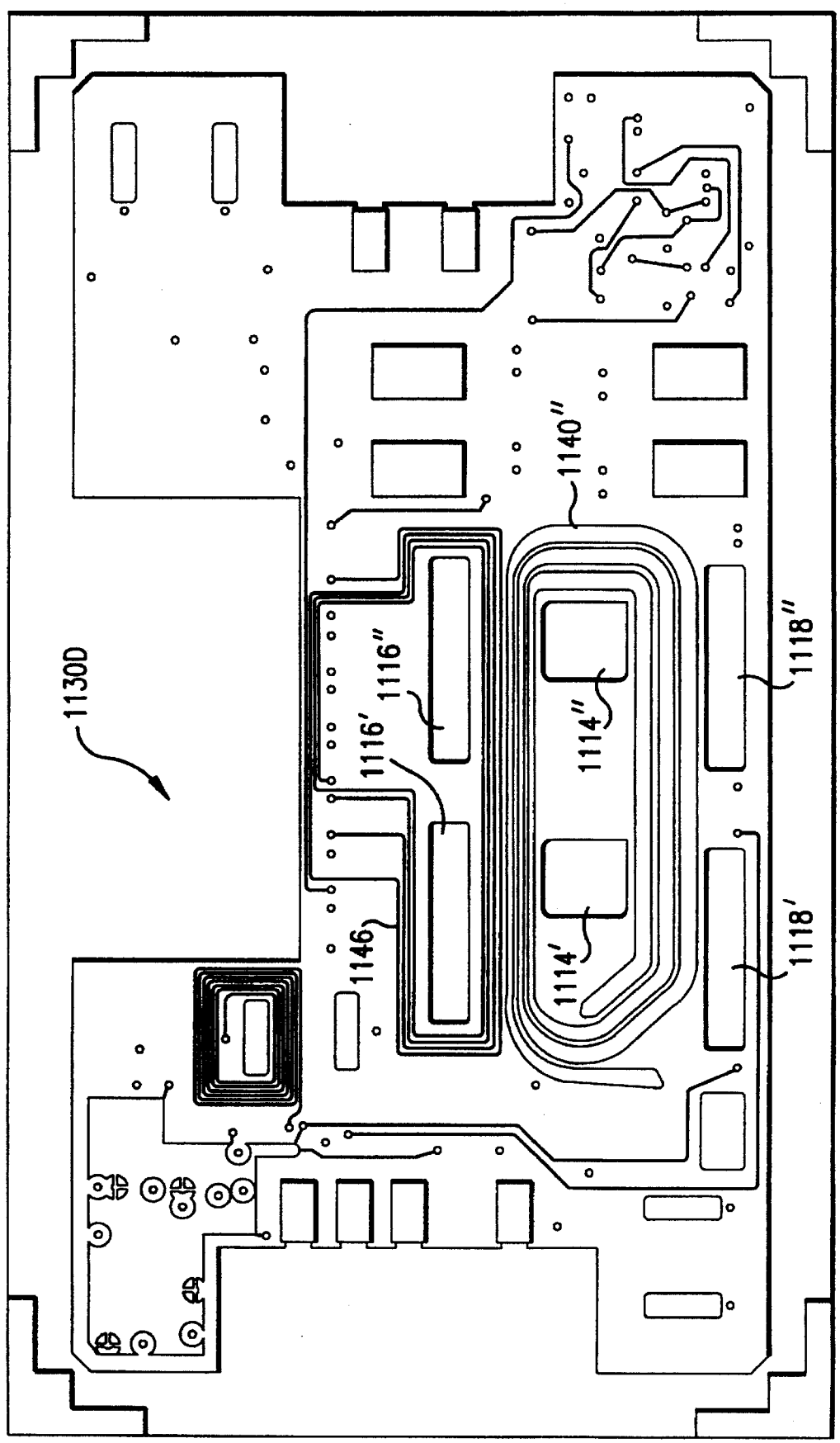
FIG. 22 is a top plan view of another printed circuit board layer showing a another secondary winding pattern to be coupled with the transformer core shown in FIGS. 17A–17C.

FIG. 19 shows a printed circuit card layer 1130A defining a secondary coil 1040' and having cutouts 1114', 1116' and 1118' and cutouts 1114", 1116" and 1118" to allow the corresponding transformer legs 1114, 1116 and 1118 of two transformer cores 1110 to pass through the printed circuit board. The secondary coil pattern 1140' passes around both central leg cutouts 1114' and 1114" to magnetically couple the secondary coil pattern 1040' with the summing point of two primary coils (see FIGS. 20 and 21 ). FIG. 20 shows another layer 1130B of the printed circuit card in which two primary coil patterns 1142' and 1142" surround the corresponding central cutout 1114' and 1114", respectively. FIG. 21 shows another printed circuit card layer 1130C in which two additional primary coil patterns 1144' and 1144" surround the corresponding central cutout 1114' and 1114", respectively. It should be noted that primary coil patterns 1144' and 1144" are coupled to corresponding primary coil patterns 1142' and 1142" to form the two primary coils that drive the secondary coil. FIG. 22 shows still another printed circuit card layer 1130D in which a secondary coil pattern 1140" surrounds the corresponding central cut-out 1114' and 1114", respectively. It should be noted that secondary coil pattern 1140' is coupled to the corresponding secondary coil pattern 1140" to form the secondary coil that is coupled to the primary coils. Finally, it should be pointed out that the ancillary coil patterns 1146 surrounding the peripheral legs 1116' and 1116" are provided to produce a signal useful for protecting the circuit from over voltage.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A small form factor power supply capable of providing between about zero and seventy five watts DC, the small form factor power supply comprising:

a low profile magnetic core for a transformer;

a printed circuit board adapted to have various circuit components mounted thereon, wherein the printed circuit board defines certain wiring patterns including the wiring patterns for primary and secondary coils of the transformer that are magnetically coupled to the core;

a driver circuit coupled to the wiring pattern for the primary coil;

a rectifier circuit formed on the printed circuit board and coupled to the secondary coil to provide a DC power source capable of delivering between zero and seventy five watts of DC power; and a case enclosing the printed circuit board, the core and the circuit components such that a thickness of the case is less than about 0.436 inches, a length is less than about 5.0 inches, and a width is less than about 2.85 inches, wherein the case reaches a maximum temperature of less than about one hundred forty degrees Fahrenheit when the rectifier circuit delivers seventy five watts DC power.

2. The small form factor power supply of claim. 1, wherein the product of the length and width of the case is less than approximately fourteen square inches.

3. The small form factor power supply of claim 1, further comprising:

a voltage and current sensing circuit coupled to the output of the rectifier; and feedback means coupling the voltage and current sensing circuit to the driver circuit.

4. The small form factor power supply of claim 2, wherein the feedback means includes an amplitude modulation circuit to amplitude modulate a signal based upon the sensed voltage and current flow; and a feedback transformer coupled to the amplitude modulation circuit.

5. The small form factor power supply of claim 4, wherein the feedback means includes a bias power supply to power the driver circuit.

6. The small form factor power supply of claim 1, for use in a volume having an ambient temperature, wherein during operation the maximum temperature on the surface of the case is less than about fifty degrees centigrade when the ambient temperature is operating is about twenty-two degrees centigrade.

7. The small form factor power supply of claim 1, wherein the primary coils include first and second primary coils electromagnetically coupled to the core to induce magnetic flux in the core;

wherein the secondary coil electromagnetically is coupled to the core to generate an electromotive force based upon the magnetic flux in the core, wherein the secondary coil is positioned relative to the primary coils such that the flux generated by the primary coils destructively interfere;

wherein the driver circuit is coupled to each of the primary coils to provide separate driving signal to each primary coil and each driving signal having a phase, a phase relationship existing between the driving signals;

wherein the rectifier is coupled to the secondary coil to provide a regulated DC signal; and wherein a feedback circuit is coupled between the output of the rectifier circuit and the driver circuit to alter the phase relationship between the driving signals to regulate the DC signal.

8. The small form factor power supply of claim 1, wherein the primary coil includes first and second primary coils electromagnetically that are coupled to the core to induce magnetic flux in the core; and wherein the secondary coil electromagnetically is coupled to the core to generate an electromotive force based upon the magnetic flux in the core, and wherein the secondary coil is positioned relative to the primary coils such that the flux generated by the primary coils constructively interfere;

wherein the driver circuit is coupled to each of the primary coils to provide separate driving signal to each primary coil and each driving signal having a phase, a phase relationship existing between the driving signals;

wherein the rectifier circuit is coupled to the secondary coil to provide a regulated DC signal; and wherein a feedback circuit is coupled between the output of the rectifier circuit and the driver circuit to alter the phase relationship between the driving signals to regulate the DC signal.

9. The small form factor power supply of claim 8, wherein the feedback circuit includes:

a current sensing circuit coupled to the secondary coil to sense current flow through the secondary coil;

a voltage sensing circuit coupled to the regulated DC signal;

an amplitude modulation circuit to amplitude modulate a signal based upon the sensed voltage and current flow; and a feedback transformer coupled to the amplitude modulation circuit.

10. The small form factor power supply of claim 8, wherein the magnetic core is an E block type and each primary coil is mounted on an outer leg of the core and the secondary coil is mounted on an inner leg.

11. The small form factor power supply of claim 1, further including at least one heat sink coupled to the various circuit components and the case to maintain the maximum temperature of the case at less than about one hundred forty degrees Fahrenheit.

12. The small form factor power supply of claim 1, wherein the case includes flat top and bottom surfaces.

13. The small form factor power supply of claim 1, wherein at least one surface of the case includes louvers to improve heat dissipation from the various components enclosed in the case.

14. A small form factor power supply capable of providing between about zero and seventy five watts DC, the small form factor power supply comprising:

a low profile magnetic core for a transformer;

a printed circuit board adapted to have various circuit components mounted thereon, wherein the printed circuit board defines certain wiring patterns including the wiring patterns for primary and secondary coils of the transformer that are magnetically coupled to the core;

a driver circuit coupled to the wiring pattern for the primary coil;

a rectifier circuit formed on the printed circuit board and coupled to the secondary coil to provide a DC power source capable of delivering between zero and seventy five watts of DC power; and a case enclosing the printed circuit board, the core and the circuit components, wherein the case has a thickness, a length, and a width such that the product of the length and width of the case is less than about fourteen square inches, and wherein the case reaches a maximum temperature of less than about one hundred forty degrees Fahrenheit when the rectifier circuit delivers seventy five watts DC power.

15. The small form factor power supply of claim 14, further comprising:

a voltage and current sensing circuit coupled to the output of the rectifier; and feedback means coupling the voltage and current sensing circuit to the driver circuit.

16. The small form factor power supply of claim 15, wherein the feedback means includes an amplitude modulation circuit to amplitude modulate a signal based upon the sensed voltage and current flow; and a feedback transformer coupled to the amplitude modulation circuit.

17. The small form factor power supply of claim 16, wherein the feedback means includes a bias power supply to power the driver circuit.

18. The small form factor power supply of claim 14, for use in a volume having an ambient temperature, wherein during operation the maximum temperature on the surface of the case is less than about fifty degrees centigrade when the ambient temperature is operating is about twenty-two degrees centigrade.

19. The small form factor power supply of claim 14, wherein the primary coils include first and second primary coils electromagnetically coupled to the core to induce magnetic flux in the core;

wherein the secondary coil electromagnetically is coupled to the core to generate an electromotive force based upon the magnetic flux in the core, wherein the secondary coil is positioned relative to the primary coils such that the flux generated by the primary coils destructively interfere;

wherein the driver circuit is coupled to each of the primary coils to provide; separate driving signal to each primary coil and each driving signal having a phase, a phase relationship existing between the driving signals;

wherein the rectifier is coupled to the secondary coil to provide a regulated DC signal; and wherein a feedback circuit is coupled between the output of the rectifier circuit and the driver circuit to alter the phase relationship between the driving signals to regulate the DC signal.

20. The small form factor power supply of claim 14, wherein the primary coil includes first and second primary coils electromagnetically that are coupled to the core to induce magnetic flux in the core; and wherein the secondary coil electromagnetically is coupled to the core to generate an electromotive force based upon the magnetic flux in the core, and wherein the secondary coil is positioned relative to the primary coils such that the flux generated by the primary coils constructively interfere;

wherein the driver circuit is coupled to each of the primary coils to provide a separate driving signal to each primary coil and each driving signal having a phase, a phase relationship existing between the driving signals;

wherein the rectifier circuit is coupled to the secondary coil to provide a regulated DC signal; and wherein a feedback circuit is coupled between the output of the rectifier circuit and the driver circuit to alter the phase relationship between the driving signals to regulate the DC signal.

21. The small form factor power supply of claim 20, wherein the feedback circuit includes:

a current sensing circuit coupled to the secondary coil to sense current flow through the secondary coil;

a voltage sensing circuit coupled to the regulated DC signal;

an amplitude modulation circuit to amplitude modulate a signal based upon the sensed voltage and current flow; and a feedback transformer coupled to the amplitude modulation circuit.

22. The small form factor power supply of claim 21, wherein the magnetic core is an E block type and each primary coil is mounted on an outer leg of the core and the secondary coil is mounted on an inner leg.

23. The small form factor power supply of claim 14, wherein the thickness of the case is less than about 0.436 inches, the length is less than about 5.0 inches, and the width is less than about 2.85 inches.

24. The small form factor power supply of claim 14, further including at least one heat sink coupled to the various circuit components and the case to maintain the maximum temperature of the case at less than about one hundred forty degrees Fahrenheit.

25. The small form factor power supply of claim 14, wherein the case includes flat top and bottom surfaces.

26. The small form factor power supply of claim 14, wherein at least one surface of the case includes louvers to improve heat dissipation from the various components enclosed in the case.

27. The small factor power supply of claim 1, further including at least one heat sink thermally coupled to at least one of the various circuit components and the case, and wherein at least one surface of the case includes louvers defining openings to improve heat dissipation from the various components and the at least one heat sink enclosed in the case.

28. The small form factor power supply of claim 27, wherein the at least one heat sink is positioned in the case adjacent to the louvers of the at least one surface of the case.

29. The small form factor power supply of claim 27, wherein the at least one heat sink covers the openings defined by the louvers on the at least one surface of the case to resist penetration of liquids into the case.

30. The small factor power supply of claim 14, further including at least one heat sink thermally coupled to at least one of the various circuit components and the case, and wherein at least one surface of the case includes louvers defining openings to improve heat dissipation from the various components and the at least one heat sink enclosed in the case.

31. The small form factor power supply of claim 30, wherein the at least one heat sink is positioned in the case adjacent to the louvers of the at least one surface of the case.

32. The small form factor power supply of claim 30, wherein the at least one heat sink covers the openings defined by the louvers on the at least one surface of the case to resist penetration of liquids into the case.

33. A small form factor power supply capable of providing between about zero and seventy five watts DC, the small form factor power supply comprising:

a low profile magnetic core for a transformer;

a printed circuit board adapted to have various circuit components mounted thereon, wherein the printed circuit board defines certain wiring patterns including the wiring patterns for primary and secondary coils of the transformer that are magnetically coupled to the core;

a driver circuit coupled to the wiring pattern for the primary coil;

a rectifier circuit formed on the printed circuit board and coupled to the secondary coil to provide a DC power source capable of delivering between zero and seventy five watts of DC power;

at least one heat sink coupled to the various circuit components; and a case including at least one surface and enclosing the printed circuit board, the core and the circuit components and at least one heat sink, wherein at least one surface of the case includes louvers defining openings to improve heat dissipation from the various components and the at least one heat sink enclosed in the case, and wherein the case reaches a maximum temperature of less than about one hundred forty degrees Fahrenheit when the rectifier circuit delivers seventy five watts DC power.

34. The small form factor power supply of claim 33, wherein the product of a length and a width of the case is less than approximately fourteen square inches.

35. The small form factor power supply of claim 33, further comprising:

a voltage and current sensing circuit coupled to the output of the rectifier; and feedback means coupling the voltage and current sensing circuit to the driver circuit.

36. The small form factor power supply of claim 35, wherein the feedback means includes an amplitude modulation circuit to amplitude modulate a signal based upon the sensed voltage and current flow; and a feedback transformer coupled to the amplitude modulation circuit.

37. The small form factor power supply of claim 36, wherein the feedback means includes a bias power supply to power the driver circuit.

38. The small form factor power supply of claim 33, for use in a volume having an ambient temperature, wherein during operation the maximum temperature on the surface of the case is less than about fifty degrees centigrade when the ambient temperature is operating is about twenty-two degrees centigrade.

39. The small form factor power supply of claim 33, wherein the primary coils include first and second primary coils electromagnetically coupled to the core to induce magnetic flux in the core;

wherein the secondary coil electromagnetically is coupled to the core to generate an electromotive force based upon the magnetic flux in the core, wherein the secondary coil is positioned relative to the primary coils such that the flux generated by the primary coils destructively interfere;

wherein the driver circuit is coupled to each of the primary coils to provide a separate driving signal to each primary coil and each driving signal having a phase, a phase relationship existing between the driving signals;

wherein the rectifier is coupled to the secondary coil to provide a regulated DC signal; and wherein a feedback circuit is coupled between the output of the rectifier circuit and the driver circuit to alter the phase relationship between the driving signals to regulate the DC signal.

40. The small form factor power supply of claim 33, wherein the case includes flat top and bottom surfaces.

41. The small form factor power supply of claim 33, wherein the at least one heat sink is positioned in the case adjacent to the louvers of the at least one surface of the case.

42. The small form factor power supply of claim 33, wherein the at least one heat sink covers the openings defined by the louvers on the at least one surface of the case to resist penetration of liquids into the case.

43. A small form factor power supply capable of providing between about zero and seventy five watts DC, the small form factor power supply comprising:

a low profile magnetic core for a transformer;

a printed circuit board adapted to have various circuit components mounted thereon, wherein the printed circuit board defines certain wiring patterns including the wiring patterns for primary and secondary coils of the transformer that are magnetically coupled to the core;

a driver circuit coupled to the wiring pattern for the primary coil;

a rectifier circuit formed on the printed circuit board and coupled to the secondary coil to provide a DC power source capable of delivering between zero and seventy five watts of DC power;

at least one heat sink coupled to the various circuit components; and a case including at least one surface and enclosing the printed circuit board, the core and the circuit components and at least one heat sink, wherein at least one surface of the case includes louvers defining openings to improve heat dissipation from the various components and the at least one heat sink enclosed in the case, and wherein the at least one heat sink covers the openings defined by the louvers on the at least one surface of the case to resist penetration of liquids into the case.

44. The small form factor power supply of claim 1, wherein the small form factor power supply is programmable to provide different power and current characteristics to match particular devices utilizing power from the small form factor power supply.

45. The small form factor power supply of claim 44, wherein the small form factor power supply is programmable by utilizing additional resistors coupled to ground.

46. The small form factor power supply of claim 44, wherein the small form factor power supply includes an output for connecting to various cables to deliver power to the different devices, wherein the cables are formed to effect the output of the small form factor power supply.

47. The small form factor power supply of claim 14, wherein the small form factor power supply is programmable to provide different power and current characteristics to match particular devices utilizing power from the small form factor power supply.

48. The small form factor power supply of claim 47, wherein the small form factor power supply is programmable by utilizing additional resistors coupled to ground.

49. The small form factor power supply of claim 47, wherein the small form factor power supply includes an output for connecting to various cables to deliver power to the different devices, wherein the cables are formed to effect the output of the small form factor power supply.

50. The small form factor power supply of claim 33, wherein the small form factor power supply is programmable to provide different power and current characteristics to match particular devices utilizing power from the small form factor power supply.

51. The small form factor power supply of claim 50, wherein the small form factor power supply is programmable by utilizing additional resistors coupled to ground.

52. The small form factor power supply of claim 50, wherein the small form factor power supply includes an output for connecting to various cables to deliver power to the different devices, wherein the cables are formed to effect the output of the small form factor power supply.

53. The small form factor power supply of claim 43, wherein the small form factor power supply is programmable to provide different power and current characteristics to match particular devices utilizing power from the small form factor power supply.

54. The small form factor power supply of claim 53, wherein the small form factor power supply is programmable by utilizing additional resistors coupled to ground.

55. The small form factor power supply of claim 53, wherein the small form factor power supply includes an output for connecting to various cables to deliver power to the different devices, wherein the cables are formed to effect the output of the small form factor power supply.

* * * * *